United States Patent
Shimizu et al.

(10) Patent No.: US 10,211,301 B1
(45) Date of Patent: Feb. 19, 2019

(54) SEMICONDUCTOR DEVICE, INVERTER CIRCUIT, DRIVING DEVICE, VEHICLE, ELEVATOR, POWER SUPPLY CIRCUIT, AND COMPUTER

(71) Applicant: Kabushiki Kaisha Toshiba, Minato-ku (JP)

(72) Inventors: Tatsuo Shimizu, Shinagawa (JP); Toshiya Yonehara, Kawasaki (JP); Hiroshi Ono, Sategaya (JP); Daimotsu Kato, Kawasaki (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 15/905,872

(22) Filed: Feb. 27, 2018

(30) Foreign Application Priority Data

Nov. 22, 2017 (JP) .................. 2017-224449

(51) Int. Cl.
*H01L 29/40* (2006.01)
*H01L 29/16* (2006.01)
(Continued)

(52) U.S. Cl.
CPC ............ *H01L 29/408* (2013.01); *G06F 1/181* (2013.01); *H01L 29/1608* (2013.01);
(Continued)

(58) Field of Classification Search
CPC ............. H01L 29/1608; H01L 29/7802; H01L 29/518; H01L 29/517; H01L 29/513
See application file for complete search history.

(56) References Cited

U.S. PATENT DOCUMENTS 9,397,185 B2 7/2016 Watanabe et al.
9,728,608 B2 8/2017 Shimizu et al.
(Continued)

FOREIGN PATENT DOCUMENTS

JP 2005-183597 7/2005
JP 2014-110402 6/2014
(Continued)

OTHER PUBLICATIONS

Takuji Hosoi et al., "Improved Characteristics of 4H-SiC MISFET with AlON/Nitrided $SiO_2$ Stacked Gate Dielectrics", Materials Science Forum vols. 645-648, 2010, pp. 991-994.
(Continued)

*Primary Examiner* — Dung A. Le
(74) *Attorney, Agent, or Firm* — Oblon, McClelland, Maier & Neustadt, L.L.P.

(57) ABSTRACT

A semiconductor device according to an embodiment includes: a wide bandgap semiconductor layer; a gate electrode; and a gate insulating layer disposed between the wide bandgap semiconductor layer and the gate electrode, including a first silicon oxide film, a second silicon oxide film between the first silicon oxide film and the gate electrode, and a first aluminum oxynitride film between the first silicon oxide film and the second silicon oxide film, and having a first atomic ratio of nitrogen relative to a sum of oxygen and nitrogen at a first position in the first aluminum oxynitride film which is lower than a second atomic ratio of nitrogen relative to a sum of oxygen and nitrogen at a second position, closer to the second silicon oxide film than the first position, in the first aluminum oxynitride film.

21 Claims, 17 Drawing Sheets

(51) Int. Cl.
   H01L 29/20 (2006.01)
   H01L 29/51 (2006.01)
   G06F 1/18 (2006.01)
   H01L 29/78 (2006.01)
   B61C 3/00 (2006.01)
   H01L 29/778 (2006.01)
   H02P 27/06 (2006.01)
   H02M 7/00 (2006.01)
   B60R 16/02 (2006.01)
   H01L 29/423 (2006.01)

(52) U.S. Cl.
   CPC ........ H01L 29/2003 (2013.01); H01L 29/513 (2013.01); *B60R 16/02* (2013.01); *B61C 3/00* (2013.01); *H01L 29/4236* (2013.01); *H01L 29/7787* (2013.01); *H01L 29/7802* (2013.01); *H01L 29/7813* (2013.01); *H02M 7/003* (2013.01); *H02P 27/06* (2013.01)

(56) References Cited

U.S. PATENT DOCUMENTS

| | | | |
|---|---|---|---|
| 2016/0027887 A1* | 1/2016 | Yuan | H01L 29/78696 257/43 |
| 2016/0284804 A1* | 9/2016 | Shimizu | H01L 29/1608 |
| 2017/0148886 A1 | 5/2017 | Nakano et al. | |
| 2017/0301760 A1 | 10/2017 | Shimizu et al. | |

FOREIGN PATENT DOCUMENTS

| | | |
|---|---|---|
| JP | 2014-175314 | 9/2014 |
| JP | 2016-181673 | 10/2016 |

OTHER PUBLICATIONS

U.S. Appl. No. 15/634,116, filed Jun. 27, 2017, 2017/0301760 A1 Oct. 2017, Tatsuo Shimizu et al.

* cited by examiner

SEMICONDUCTOR DEVICE, INVERTER CIRCUIT, DRIVING DEVICE, VEHICLE, ELEVATOR, POWER SUPPLY CIRCUIT, AND COMPUTER

CROSS-REFERENCE TO RELATED APPLICATION

This application is based upon and claims the benefit of priority from Japanese Patent Application No. 2017-224449, filed on Nov. 22, 2017, the entire contents of which are incorporated herein by reference.

FIELD

Embodiments described herein relate generally to a semiconductor device, an inverter circuit, a driving device, a vehicle, an elevator, a power supply circuit, and a computer.

BACKGROUND

Wide bandgap semiconductors such as nitride semiconductors containing silicon carbide (SiC) and gallium (Ga) are expected as materials for next-generation semiconductor devices. The wide bandgap semiconductor has a wider bandgap so that breakdown field strength increases as compared to silicon (Si). It is possible to realize a transistor with a high breakdown voltage by utilizing such a characteristic.

The high breakdown voltage transistor requires to have a high threshold voltage in order to realize a stable circuit operation. However, in a transistor using silicon carbide, for example, there occurs a problem that carrier mobility is lowered if an impurity concentration in a region where a channel is formed is increased in order to increase the threshold voltage. In addition, for example, in a high electron mobility transistor (HEMT) using a nitride semiconductor containing gallium (Ga), a two-dimensional electron gas is present right below a gate electrode, and thus, it is difficult to increase the threshold voltage.

DETAILED DESCRIPTION

A semiconductor device according to an embodiment includes: a wide bandgap semiconductor layer; a gate electrode; and a gate insulating layer disposed between the wide bandgap semiconductor layer and the gate electrode, the gate insulating layer including a first silicon oxide film, a second silicon oxide, and a first aluminum oxynitride film, the second silicon oxide film disposed between the first silicon oxide film and the gate electrode, the first aluminum oxynitride film between the first silicon oxide film and the second silicon oxide film, a first atomic ratio of nitrogen relative to a sum of oxygen and nitrogen at a first position in the first aluminum oxynitride film being lower than a second atomic ratio of nitrogen relative to a sum of oxygen and nitrogen at a second position in the first aluminum oxynitride film, and the second position being closer to the second silicon oxide film than the first position.

In the following description, notations $n^+$, n, $n^-$ $p^+$, p, and $p^-$ indicate relative levels of impurity concentration in each conductivity type. That is, $n^+$ indicates an n-type impurity concentration higher than that of n, and $n^-$ indicates an n-type impurity concentration lower than that of n. In addition, $p^+$ indicates a p-type impurity concentration higher than that of p, and $p^-$ indicates a p-type impurity concentration lower than that of p. In some cases, an $n^+$-type and an $n^-$-type are simply referred to as an n-type, and a $p^+$-type and a $p^-$-type are simply referred to as a p-type.

First Embodiment

A semiconductor device according to a first embodiment includes: a wide bandgap semiconductor layer; a gate electrode; and a gate insulating layer disposed between the wide bandgap semiconductor layer and the gate electrode, including a first silicon oxide film, a second silicon oxide film between the first silicon oxide film and the gate electrode, and a first aluminum oxynitride film between the first silicon oxide film and the second silicon oxide film, and having a first atomic ratio of nitrogen relative to a sum of nitrogen and oxygen at a first position in the first aluminum oxynitride film which is lower than a second atomic ratio of nitrogen relative to a sum of nitrogen and oxygen at a second position, closer to the second silicon oxide film than the first position, in the first aluminum oxynitride film.

Figure 1:
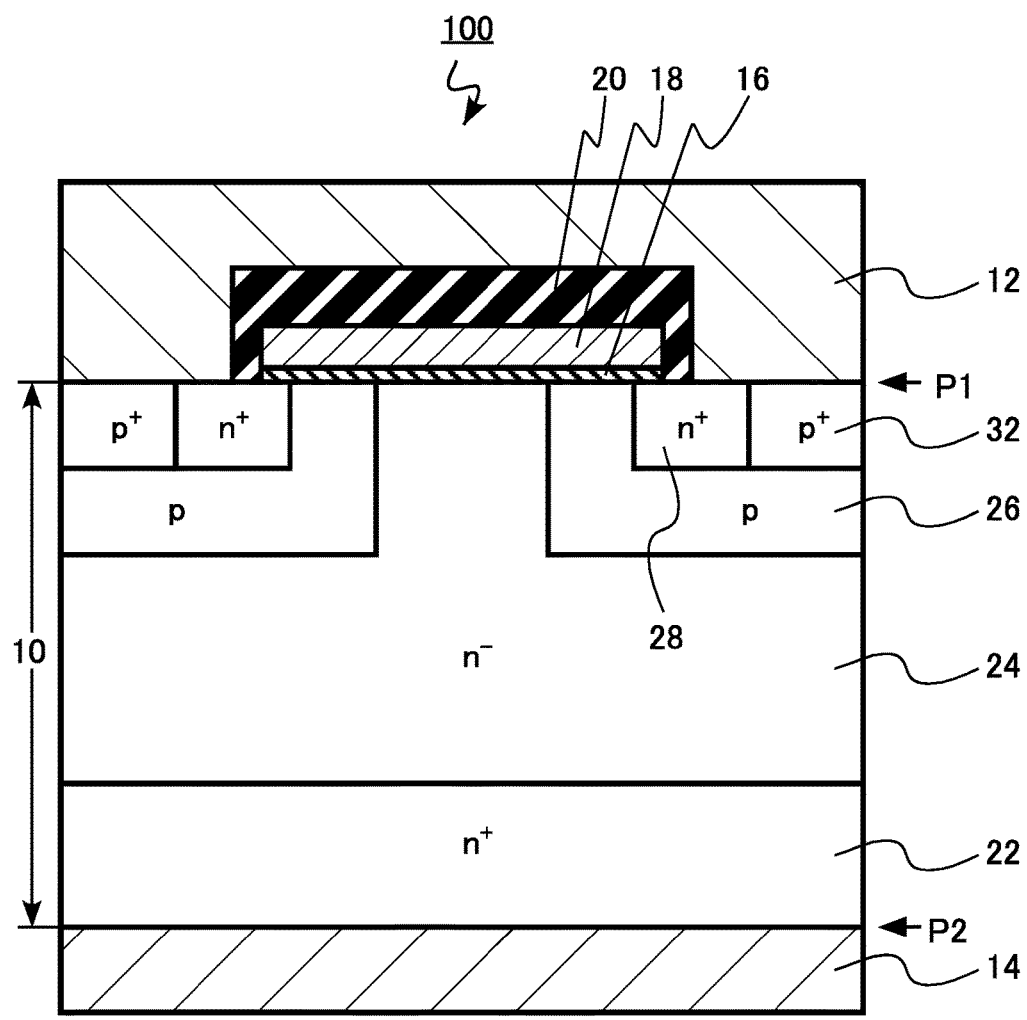
FIG. 1 is a schematic cross-sectional view of a semiconductor device of a first embodiment.

FIG. 1 is a schematic cross-sectional view of the semiconductor device according to the first embodiment. A MOSFET 100 of the first embodiment is a planar gate-type vertical metal oxide semiconductor field effect transistor (MOSFET) using silicon carbide. The MOSFET 100 is, for example, a double implantation MOSFET (DIMOSFET) in which a body region and a source region are formed by ion implantation. The MOSFET 100 is an n-type MOSFET using electrons as carriers.

The MOSFET 100 includes a silicon carbide layer 10 (wide bandgap semiconductor layer), a source electrode 12, a drain electrode 14, a gate insulating layer 16, a gate electrode 18, and an interlayer insulating layer 20.

An $n^+$-type drain region 22, an $n^-$-type drift region 24, a p-type body region 26, an $n^+$-type source region 28, and a $p^+$-type body contact region 32 are provided inside the silicon carbide layer 10.

At least a part of the silicon carbide layer 10 is provided between the source electrode 12 and the drain electrode 14. At least a part of the silicon carbide layer 10 is provided between the gate electrode 18 and the drain electrode 14. The silicon carbide layer 10 is a single crystal SiC. The silicon carbide layer 10 is, for example, a 4H—SiC.

The silicon carbide layer 10 has a first face ("P1" in FIG. 1) and a second face ("P2" in FIG. 1). Hereinafter, the first face P1 is also referred to as a front surface, and the second face P2 is referred to as a back surface. Hereinafter, a "depth" means a depth set with the first face P1 as a reference.

The first face P1 is, for example, a face inclined by 0° to 8° with respect to a (0001) face. In addition, the second face P2 is, for example, a face inclined by 0° to 8° with respect to a (000-1) face. The (0001) face is referred to as a silicon face. The (000-1) face is referred to as a carbon face.

The $n^+$-type drain region 22 is provided on the back side of the silicon carbide layer 10. The drain region 22 contains, for example, nitrogen (N) as n-type impurities. An n-type impurity concentration of the drain region 22 is, for example, $1 \times 10^{18}$ $cm^{-3}$ to $1 \times 10^{21}$ $cm^{-3}$.

The $n^-$ type drift region 24 is provided on the drain region 22. The drift region 24 contains, for example, nitrogen (N) as n-type impurities. An n-type impurity concentration of the drift region 24 is lower than the n-type impurity concentration of the drain region 22. The n-type impurity concentration of the drift region 24 is, for example, $4 \times 10^{14}$ $cm^{-3}$ to $1 \times 10^{17}$ $cm^{-3}$. A thickness of the drift region 24 is, for example, 5 μm to 150 μm.

The body region 26 is provided between the source electrode 12 and the drift region 24. A contact face between the body region 26 and the gate insulating layer 16 functions as a channel region of the MOSFET 100.

The body region 26 contains, for example, aluminum (Al) as p-type impurities. A p-type impurity concentration of the body region 26 is, for example, $1 \times 10^{17}$ $cm^{-3}$ to $1 \times 10^{19}$ $cm^{-3}$.

A depth of the body region 26 is, for example, 0.3 μm to 0.8 μm.

The source region 28 is provided between the source electrode 12 and the body region 26. The source region 28 is spaced apart from the drift region 24.

The source region 28 contains, for example, phosphorus (P) as n-type impurities. An n-type impurity concentration of the source region 28 is higher than the n-type impurity concentration of the drift region 24.

The n-type impurity concentration of the source region 28 is, for example, $1 \times 10^{19}$ $cm^{-3}$ to $1 \times 10^{21}$ $cm^{-3}$. A depth of the source region 28 is shallower than the depth of the body region 26 and is, for example, 0.1 μm to 0.3 μm.

The source region 28 is fixed, for example, to the potential of the source electrode 12.

The $p^+$-type body contact region 32 is provided between the source electrode 12 and the body region 26. A p-type impurity concentration of the body contact region 32 is higher than the p-type impurity concentration in the body region 26.

The body contact region 32 contains, for example, aluminum (Al) as p-type impurities. The p-type impurity concentration in the body contact region 32 is, for example, $1 \times 10^{19}$ $cm^{-3}$ to $1 \times 10^{21}$ $cm^{-3}$.

A depth of the body contact region 32 is, for example, 0.3 μm to 0.6 μm.

The body contact region 32 is fixed, for example, to the potential of the source electrode 12.

The gate electrode 18 is a conductive layer. The gate electrode 18 is, for example, polycrystalline silicon containing p-type impurities or n-type impurities. The gate electrode 18 may be metal.

Figure 2:
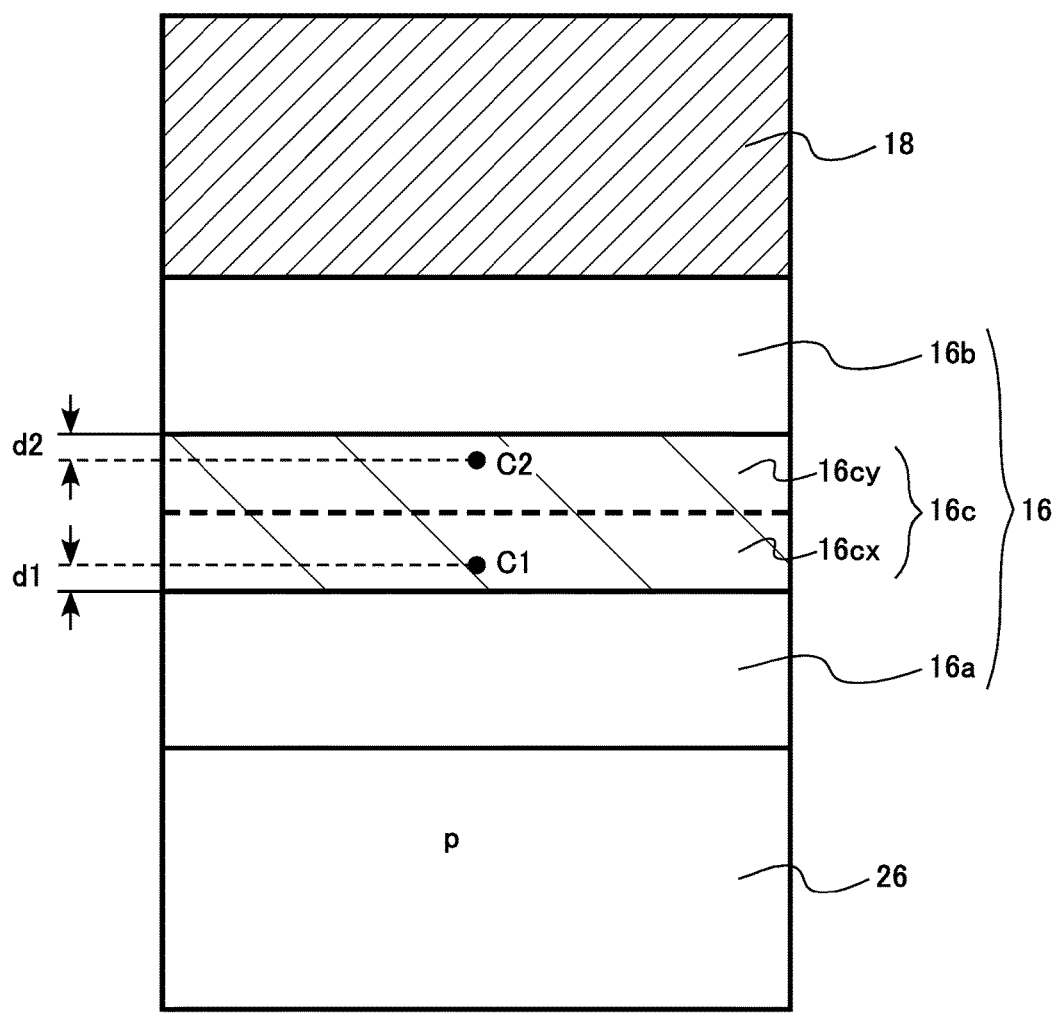
FIG. 2 is a schematic enlarged cross-sectional view of the semiconductor device according to the first embodiment.

FIG. 2 is a schematic enlarged cross-sectional view of the semiconductor device according to the first embodiment. FIG. 2 is the enlarged view of the gate insulating layer 16 between the body region 26 and the gate electrode 18.

The gate insulating layer 16 is positioned between the silicon carbide layer 10 and the gate electrode 18. The gate insulating layer 16 is provided between the gate electrode 18 and the body region 26. In addition, the gate insulating layer 16 is provided between the gate electrode 18 and the drift region 24. The gate insulating layer 16 is in contact with the body region 26, for example.

The gate insulating layer 16 includes a silicon oxide film 16a (the first silicon oxide film), a silicon oxide film 16b (the second silicon oxide film), and an aluminum oxynitride film 16c (the first aluminum oxynitride film).

A thickness of the gate insulating layer 16 is, for example, 20 nm to 100 nm. An equivalent oxide thickness (EOT) of the gate insulating layer 16 is, for example, 20 nm to 100 nm.

The silicon oxide film 16b is provided between the silicon oxide film 16a and the gate electrode 18. The aluminum oxynitride film 16c is provided between the silicon oxide film 16a and the silicon oxide film 16b. The gate insulating layer 16 has a three-layer structure of the silicon oxide film 16a/the aluminum oxynitride film 16c/the silicon oxide film 16b.

The silicon oxide film 16a is provided on the body region 26. The silicon oxide film 16a is in contact with the body region 26. The aluminum oxynitride film 16c is provided on the silicon oxide film 16a. The aluminum oxynitride film 16c is in contact with the silicon oxide film 16a. The silicon oxide film 16b is provided on the aluminum oxynitride film 16c. The silicon oxide film 16b is in contact with the aluminum oxynitride film 16c. The aluminum oxynitride film 16c is, for example, amorphous.

A film thickness of the silicon oxide film 16a is, for example, 10 nm to 50 nm. A film thickness of the silicon oxide film 16b is, for example, 1 nm to 50 nm. A film thickness of the aluminum oxynitride film 16c is, for example, 1 nm to 10 nm. The film thickness of the silicon oxide film 16a is, for example, thicker than the film thickness of the silicon oxide film 16b.

The aluminum oxynitride film 16c contains aluminum (Al), oxygen (O), and nitrogen (N) as main constituent elements. A first atomic ratio (N/(O+N)) of nitrogen relative to a sum (O+N) of oxygen (O) and nitrogen (N) at a first position (C1 in FIG. 2) in the aluminum oxynitride film 16c is lower than a second atomic ratio of nitrogen (N/(O+N)) relative to a sum (O+N) of oxygen (O) and nitrogen (N) at a second position (C2 in FIG. 2) closer to the silicon oxide film 16b than the first position C1 in the aluminum oxynitride film 16c. In other words, the aluminum oxynitride film 16c has a nitrogen concentration on the silicon carbide layer 10 side which is lower than a nitrogen concentration on the gate electrode 18 side.

The aluminum oxynitride film 16c has, for example, a two-layer structure. The aluminum oxynitride film 16c includes a first region 16cx and a second region 16cy. The second region 16cy is positioned between the first region 16cx and the silicon oxide film 16b. The first position C1 is in the first region 16cx, and the second position C2 is in the second region 16cy.

The first atomic ratio is, for example, 0.13 to 0.30. The second atomic ratio is, for example, 0.70 to 0.87.

The first position C1 is, for example, in the vicinity of an interface between the silicon oxide film 16a and the aluminum oxynitride film 16c. For example, a distance (d1 in FIG. 2) from the interface between the silicon oxide film 16a and the aluminum oxynitride film 16c to the first position C1 is 0.5 nm or shorter.

The second position C2 is, for example, in the vicinity of an interface between the silicon oxide film 16b and the aluminum oxynitride film 16c. For example, a distance (d2 in FIG. 2) from the interface between the silicon oxide film 16b and the aluminum oxynitride film 16c to the second position C2 is 0.5 nm or shorter.

For example, the distribution of the nitrogen concentration in the aluminum oxynitride film 16c may have gradient distribution of increasing from the silicon oxide film 16a side toward the silicon oxide film 16b. In other words, an atomic ratio of nitrogen in the aluminum oxynitride film 16c may have distribution of continuously or stepwise increasing from the silicon oxide film 16a side toward the silicon oxide film 16b.

It is also possible to segregate a termination element such as nitrogen (N), for example, at an interface between the silicon carbide layer 10 and the gate insulating layer 16. An interface state existing at the interface between the silicon carbide layer 10 and the gate insulating layer 16 is terminated by segregating the termination element, and the carrier mobility and reliability of the MOSFET 100 are improved.

The interlayer insulating layer 20 is provided on the gate electrode 18. The interlayer insulating layer 20 is, for example, silicon oxide.

The source electrode 12 is in contact with the source region 28. In addition, the source electrode 12 is in contact with the body contact region 32.

The source electrode 12 contains metal. The source electrode 12 contains, for example, titanium (Ti) and aluminum (Al). The metal forming the source electrode 12 is, for example, an alloy of titanium (Ti) and aluminum (Al).

The drain electrode 14 is provided on the back surface of the silicon carbide layer 10. The drain electrode 14 is in contact with the drain region 22.

The drain electrode 14 is, for example, metal or a metal semiconductor compound. The drain electrode 14 includes, for example, a material selected from the group consisting of nickel silicide, titanium (Ti), nickel (Ni), silver (Ag), and gold (Au).

Although N (nitrogen) or P (phosphorus), for example, is preferable as the n-type impurity in the first embodiment, but As (arsenic), Sb (antimony), or the like can also be applied. In addition, Al (aluminum) is preferable as the p-type impurity, but B (boron), Ga (gallium), In (indium), or the like can also be applied.

An element type and an element concentration in the gate insulating layer 16 can be measured by, for example, secondary ion mass spectrometry (SIMS) and energy dispersive X-ray spectroscopy (EDX). Each film thicknesses of the gate insulating layer 16, the silicon oxide film 16a, the silicon oxide film 16b, and the aluminum oxynitride film 16c can be measured using, for example, transmission electron microscope (TEM). In addition, for example, the distance (d1 in FIG. 2) from the interface between the silicon oxide film 16a and the aluminum oxynitride film 16c to the first position C1 and the first atomic ratio, and the distance (d2 in FIG. 2) from the interface between the silicon oxide film 16b and the aluminum oxynitride film 16c to the second position C2 and the second atomic ratio can be measured using, for example, TEM-EDX.

An impurity type and an impurity concentration in a semiconductor region can be measured by, for example, SIMS and EDX. In addition, a relative level of the impurity concentration can also be determined based on a level of a carrier concentration obtained by, for example, scanning capacitance microscopy (SCM). In addition, a distance such as a depth and a thickness of an impurity region can be obtained by SIMS, for example. In addition, a distance such as a depth, a thickness, a width, and an interval of the impurity region can also be obtained from comparison images of an SCM image and an atom probe image, for example.

Next, an example of a method for manufacturing the semiconductor device according to the first embodiment will be described.

First, the silicon carbide layer 10 is prepared. The silicon carbide layer 10 includes the n$^+$-type drain region 22 and the n$^-$-type drift region 24. The drift region 24 is formed, for example, on the n$^+$-type drain region 22 by an epitaxial growth method.

Next, the p-type body region 26, the n$^+$-type source region 28, and the p$^+$-type body contact region 32 are formed by known photolithography, ion implantation method, or the like. Next, activation annealing to activate impurities of the body region 26, the source region 28, and the body contact region 32 is performed. The activation annealing is performed under conditions, for example, that heating temperature is 1600° C. to 2000° C. and heating time is 10 minutes to 60 minutes using an inert gas such as argon (Ar) gas as an atmospheric gas.

Next, the gate insulating layer 16 is formed on the silicon carbide layer 10.

First, the silicon oxide film 16a is formed on the silicon carbide layer 10 by, for example, a chemical vapor deposition (CVD) method. Thereafter, annealing to densify the silicon oxide film 16a is performed. The annealing is performed under heating temperature of 800° C. to 1050° C. using, for example, an inert gas such as an argon (Ar) gas as an atmospheric gas.

Next, the aluminum oxynitride film 16c is formed on the silicon oxide film 16a. The aluminum oxynitride film 16c has the two-layer structure.

First, an aluminum oxynitride film, to be the first region 16cx, is formed on the silicon oxide film 16a by, for example, an atomic layer deposition (ALD) method. A condition for film formation is set such that the first atomic ratio (N/(O+N)) of nitrogen relative to the sum (O+N) of oxygen (O) and nitrogen (N) in the aluminum oxynitride film is, for example, 0.13 to 0.30. Thereafter, annealing for densifying the aluminum oxynitride film is performed. The annealing is performed under heating temperature of 800° C. to 1050° C. using, for example, an inert gas such as an argon (Ar) gas as an atmospheric gas.

Next, an aluminum oxynitride film, to be the second region 16cy, is formed on the aluminum oxynitride film, to be the first region 16cx by, for example, the ALD method. A condition for film formation is set such that the second atomic ratio (N/(O+N)) of nitrogen relative to the sum (O+N) of oxygen (O) and nitrogen (N) in the aluminum oxynitride film is, for example, 0.70 to 0.87. Thereafter, annealing for densifying the aluminum oxynitride film is performed. The annealing is performed under heating temperature of 800° C. to 1050° C. using, for example, an inert gas such as an argon (Ar) gas as an atmospheric gas.

Next, the silicon oxide film 16b is formed on the aluminum oxynitride film 16c, for example, by the CVD method. Thereafter, annealing to densify the silicon oxide film 16b is performed. The annealing is performed under heating temperature of 800° C. to 1050° C. using, for example, an inert gas such as an argon (Ar) gas as an atmospheric gas.

Thereafter, high-temperature annealing for densifying the gate insulating layer 16 is performed. The high-temperature annealing is performed under heating temperature of 1200° C. to 1350° C. for a heating time of one minute or ten minutes using, for example, an inert gas such as an argon (Ar) gas as an atmospheric gas.

The annealing for densification is performed at lower temperature than high-temperature annealing immediately after formation of each of the silicon oxide film 16a, the aluminum oxynitride film, to be the first region 16cx, the aluminum oxynitride film, to be the second region 16cy, and the silicon oxide film 16b, so that it is possible to suppress mutual diffusion of elements at the high-temperature annealing.

Next, the gate electrode 18, made of polysilicon, for example, is formed on the gate insulating layer 16. Then, the interlayer insulating layer 20, made of silicon oxide, for example, is formed on the gate electrode 18.

Next, the conductive source electrode 12 is formed on the source region 28 and the body contact region 32. Next, the conductive drain electrode 14 is formed on a side of the silicon carbide layer 10 opposite to the source electrode 12.

Thereafter, low-temperature annealing is performed in order to reduce a contact resistance between the source electrode 12 and the drain electrode 14. The low-temperature annealing is performed, for example, in an argon gas atmosphere at 300° C. to 500° C.

The MOSFET 100 illustrated in FIG. 1 is formed according to the above manufacturing method.

Hereinafter, a function and an effect of the semiconductor device of the first embodiment will be described.

The high breakdown voltage transistor requires to have a high threshold voltage in order to realize a stable circuit operation. When the impurity concentration of the body region where the channel is formed is increased in order to increase the threshold voltage in the n-type MOSFET using SiC, there occurs a problem that the mobility of electrons as carriers is lowered. For this reason, it is desirable to increase the threshold voltage of the MOSFET using a method other than increasing the impurity concentration of the body region.

As a result of studies conducted by the inventors according to first principle calculation, it has been clearly found that a direction of a fixed dipole formed at the interface between the silicon oxide film and the aluminum oxynitride film is reversed depending on a nitrogen concentration in the aluminum oxynitride film. The MOSFET 100 of the first embodiment has a MOS structure that realizes a high threshold voltage based on the above-described new findings.

In the MOSFET 100 of the first embodiment, the nitrogen concentration in the aluminum oxynitride film sandwiched between the silicon oxide films is lower on the silicon carbide layer 10 side than on the gate electrode 18 side. With this configuration, the high threshold voltage is realized.

Figure 3:
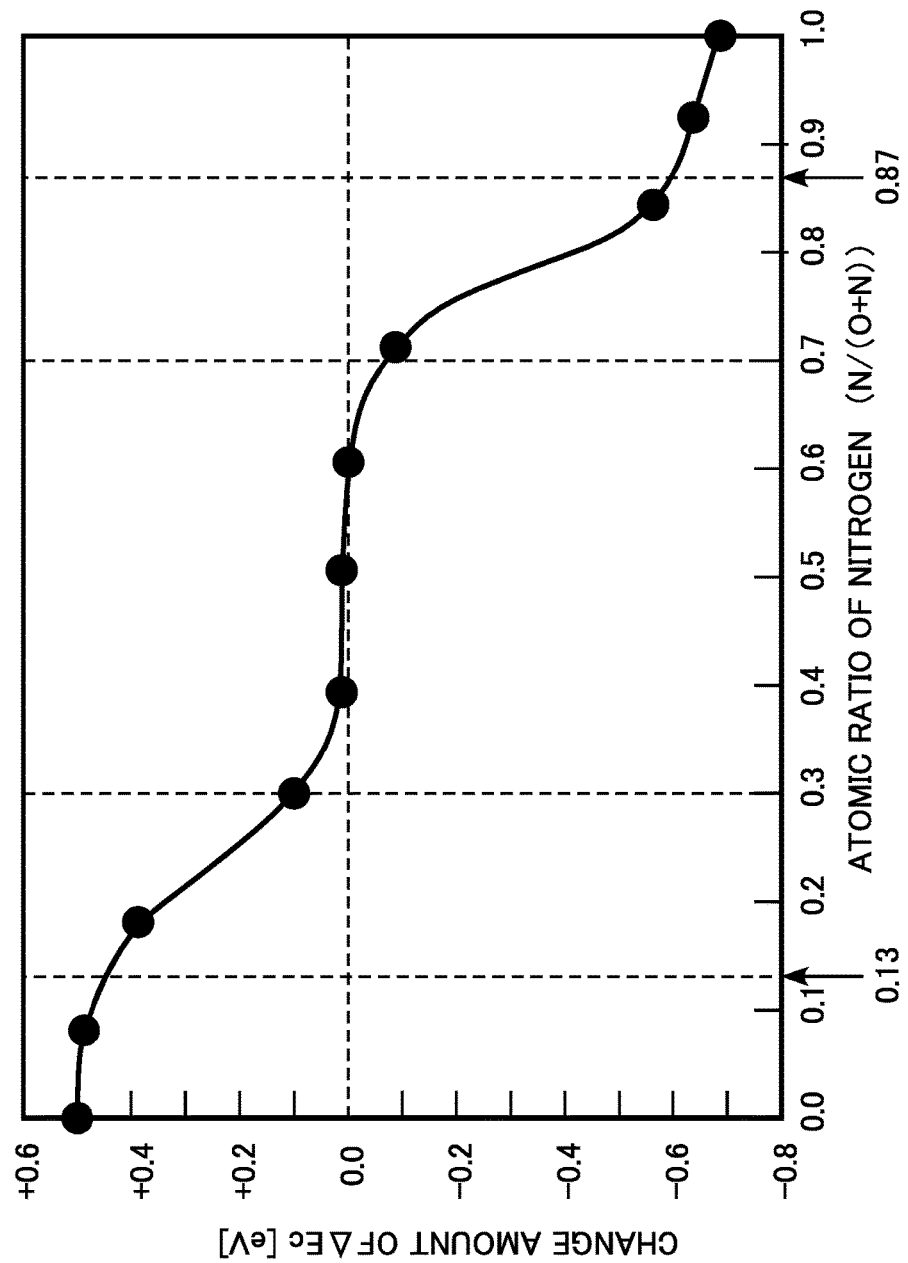
FIG. 3 is an explanatory graph of a function and an effect of the semiconductor device according to the first embodiment.

FIG. 3 is an explanatory graph of the function and the effect of the semiconductor device according to the first embodiment. FIG. 3 illustrates dependence of a change amount of a difference (ΔEc), between energy at a lower end of a conduction band of silicon oxide and energy at a lower end of a conduction band of silicon oxynitride, on the atomic ratio of nitrogen.

The change in the difference (ΔEc) between the energy at the lower end of the conduction band of silicon oxide and the energy at the lower end of the conduction band of silicon oxynitride is caused by the fixed dipole formed at the interface between the silicon oxide film and the aluminum oxynitride film. The atomic ratio of nitrogen in FIG. 3 means the atomic ratio (N/(O+N)) of nitrogen relative to the sum (O+N) of oxygen (O) and nitrogen (N) in the aluminum oxynitride film.

The change amount of ΔEc indicates a positive value in a region where the atomic ratio of nitrogen is low, that is, the region where the nitrogen concentration is low in the aluminum oxynitride film. On the other hand, the change amount of ΔEc indicates a negative value in a region where the atomic ratio of nitrogen is high, that is, the region where the nitrogen concentration is high in the aluminum oxynitride film. Here, a direction of a change in which ΔEc apparently increases is referred to as "positive", and a direction of a change in which ΔEc apparently decreases is referred to as "negative".

In this manner, the direction of the change amount of ΔEc is reversed depending on the nitrogen concentration in the aluminum oxynitride film. This indicates that the direction of the fixed dipole formed at the interface between the silicon oxide film and the aluminum oxynitride film is reversed depending on the nitrogen concentration in the aluminum oxynitride film.

When the nitrogen concentration in the aluminum oxynitride film is low, the fixed dipole is formed to be negative on the silicon oxide film side and positive on the aluminum oxynitride film side by biasing oxygen having a negative charge toward the silicon oxide film side with respect to the interface between the silicon oxide film and the aluminum oxynitride film. On the other hand, when the nitrogen concentration in the aluminum oxynitride film is high, the fixed dipole is formed to be positive on the silicon oxide film side and negative on the aluminum oxynitride film side by biasing aluminum having a positive charge toward the silicon oxide film side with respect to the interface between the silicon oxide film and the aluminum oxynitride film.

Figure 4A:
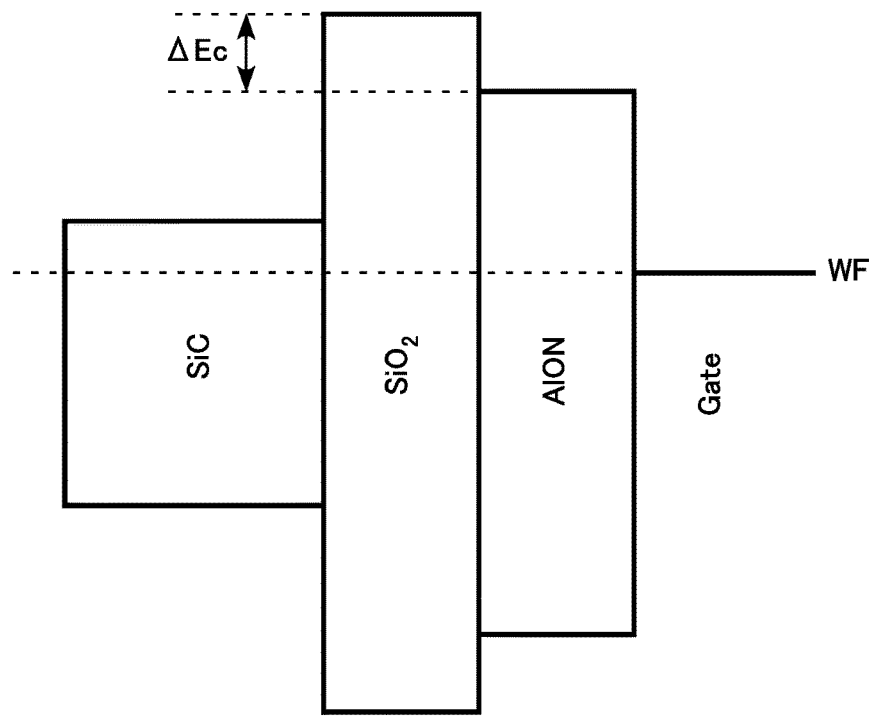
FIGS. 4A and 4B are explanatory views of the function and effect of the semiconductor device according to the first embodiment.
Figure 4B:
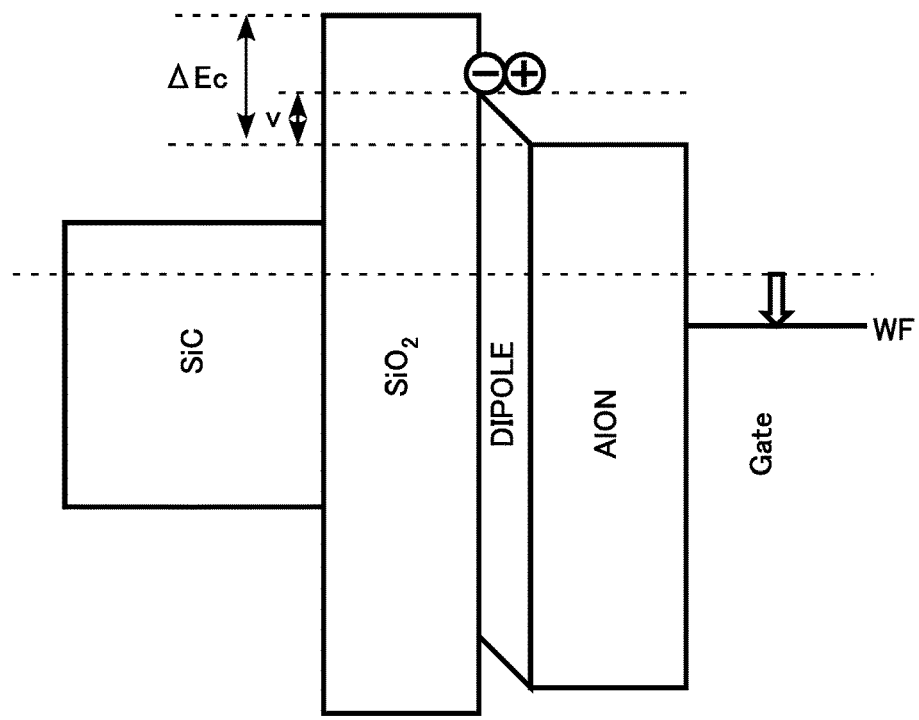

FIGS. 4A and 4B are explanatory views of the function and effect of the semiconductor device according to the first embodiment. FIGS. 4A and 4B are energy band diagrams of an MOS structure according to a first comparative example.

The MOS structure according to the first comparative example has a SiC layer ("SiC" in FIGS. 4A and 4B), a gate electrode ("Gate" in FIGS. 4A and 4B), and a gate insulating layer between the SiC layer and the gate electrode. The gate insulating layer has a silicon oxide film ("SiO$_2$" in FIGS. 4A and 4B) and an aluminum oxynitride film ("AlON" in FIGS. 4A and 4B). It is assumed a case where a nitrogen concentration of the aluminum oxynitride film is low, that is, a case where an atomic ratio of nitrogen is low. The nitrogen concentration in the aluminum oxynitride film is uniform. It is assumed a case where the gate electrode is a metal.

FIG. 4A is the energy band diagram in a case of ignoring the presence of a fixed dipole, and FIG. 4B is the energy band diagram in a case of considering the presence of the fixed dipole.

As illustrated in FIG. 4A, there is a difference ($\Delta Ec$) between energy at a lower end of a conduction band of the silicon oxide film and energy at a lower end of a conduction band of the silicon oxynitride film. As illustrated in FIG. 4B, when the nitrogen concentration of the aluminum oxynitride film is low, the fixed dipole, which is negative on the silicon oxide film side and positive on the aluminum oxynitride film side, is formed. Therefore, $\Delta Ec$ apparently changes in an increasing direction (positive direction). The change amount is indicated by "v" in FIG. 4B.

A work function ("WF" in FIGS. 4A and 4B) of the gate electrode also apparently increases as $\Delta Ec$ apparently increases. Therefore, the threshold voltage of the MOSFET having the MOS structure of the first comparative example increases.

However, the change amount of $\Delta Ec$ in the positive direction does not exceed 0.5 eV as apparent from FIG. 3. For example, when the atomic ratio of nitrogen is 0.13, the change amount of $\Delta Ec$ in the positive direction is 0.42 eV. Thus, the increase of the threshold voltage in the case of using the MOS structure of the first comparative example is 0.5 V or less, which is not necessarily sufficient.

Figure 5:
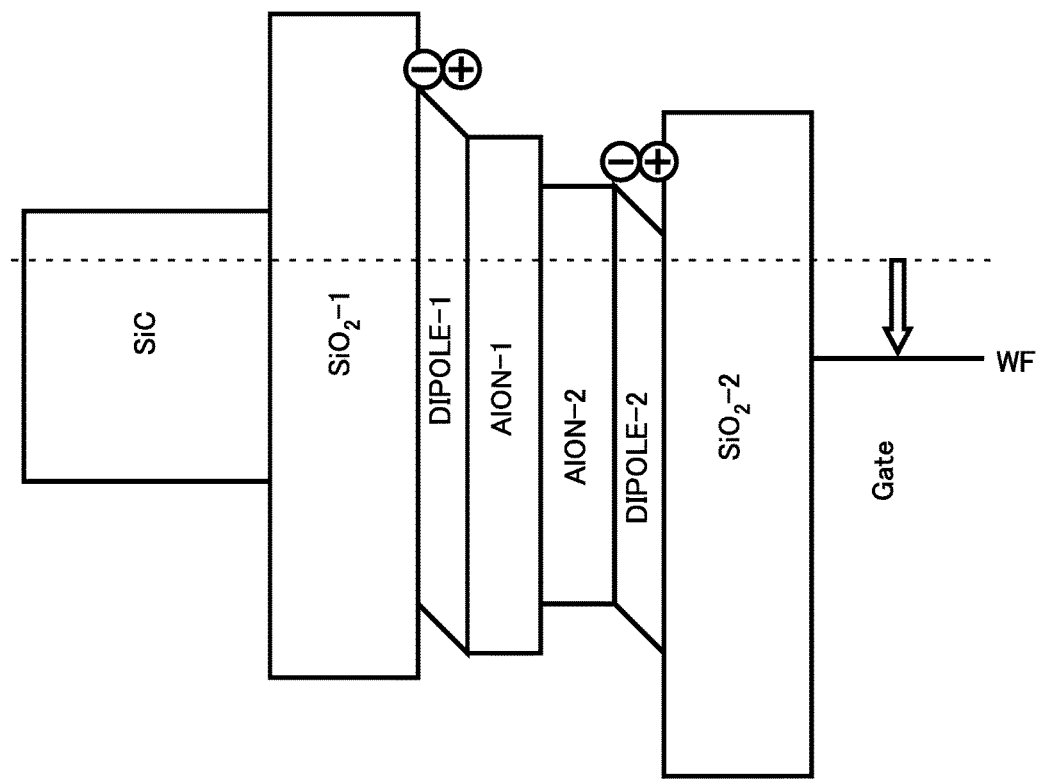
FIG. 5 is an explanatory view of the function and effect of the semiconductor device according to the first embodiment.

FIG. 5 is an explanatory diagram of the function and the effect of the semiconductor device according to the first embodiment. FIG. 5 is an energy band diagram of the MOS structure of the first embodiment.

The gate insulating layer 16 having the MOS structure according to the first embodiment has the silicon oxide film 16a ("SiO$_2$-1" in FIG. 5), the aluminum oxynitride film 16c ("AlON-1" and "AlON-2" in FIG. 5), and the silicon oxide film 16b ("SiO$_2$-2" in FIG. 5). The aluminum oxynitride film 16c has the first region 16cx ("AlON-1" in FIG. 5) and the second region 16cy ("AlON-2" in FIG. 5). A nitrogen concentration of the first region 16cx is lower than a nitrogen concentration of the second region 16cy. In other words, the atomic ratio of nitrogen in the first region 16cx is lower than the atomic ratio of nitrogen in the second region 16cy. It is assumed a case where the gate electrode is a metal.

Incidentally, a bandgap of the first region 16cx is larger than that of the second region 16cy since the nitrogen concentration of the first region 16cx is lower than that of the second region 16cy.

Since the nitrogen concentration of the first region 16cx is low, a fixed dipole ("DIPOLE-1" in FIG. 5), which is negative on the silicon oxide film 16a side and positive on the aluminum oxynitride film 16c side, is formed. On the other hand, since the nitrogen concentration of the second region 16cy is high, a fixed dipole ("DIPOLE-2" in FIG. 5), which is positive on the silicon oxide film 16b side and negative on the aluminum oxynitride film 16c side, is formed.

The work function ("WF" in FIG. 5) of the gate electrode apparently increases by the amount corresponding to the sum of the change amount of $\Delta Ec$ in the two fixed dipoles. Therefore, it is possible to further increase the threshold voltage of the MOSFET according to the MOSFET 100 of the first embodiment as compared to the MOS structure of the first comparative example. For example, when the atomic ratio (first atomic ratio) of nitrogen in the first region 16cx is 0.13 and the atomic ratio (second atomic ratio) of nitrogen in the second region 16cy is 0.87, it is possible to increase the threshold voltage by about 1.02 V (=0.42 V+0.60 V).

Figure 6:
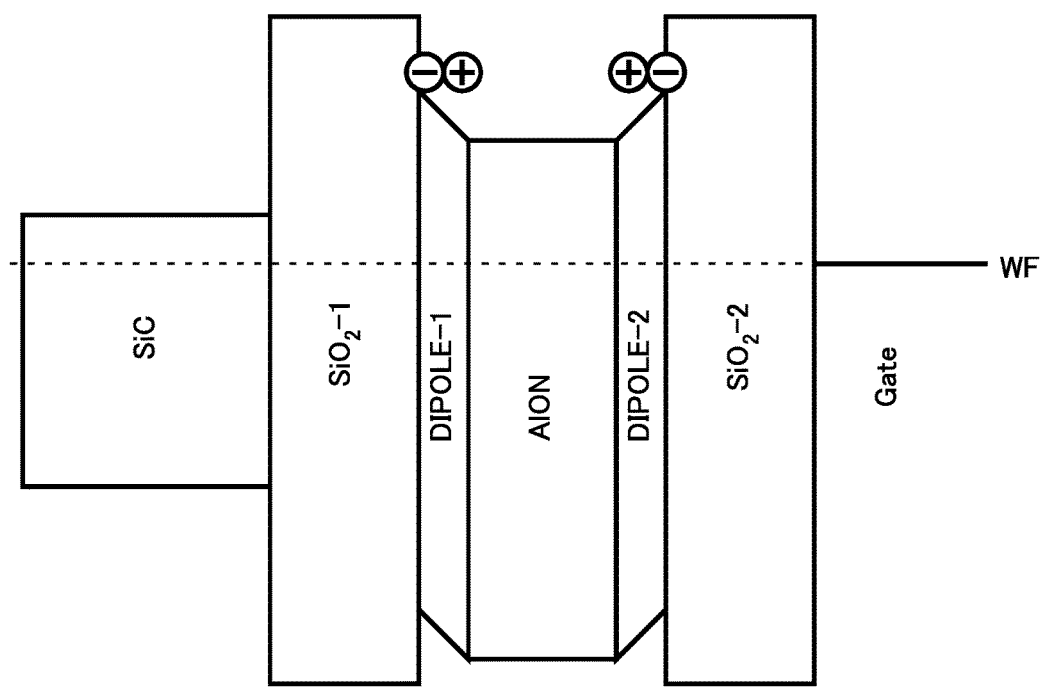
FIG. 6 is an explanatory view of the function and effect of the semiconductor device according to the first embodiment.

FIG. 6 is an explanatory view of the function and the effect of the semiconductor device according to the first embodiment. FIG. 6 is an energy band diagram of a MOS structure according to a second comparative example.

A gate insulating layer having the MOS structure according to the second comparative example has a silicon oxide film ("SiO$_2$-1" in FIG. 6), an aluminum oxynitride film ("AlON" in FIG. 6), and a silicon oxide film ("SiO$_2$-2" in FIG. 6). It is assumed that the nitrogen concentration in the aluminum oxynitride film 16c is uniform and low. It is assumed a case where a gate electrode is a metal.

Since the nitrogen concentration of the aluminum oxynitride film is low, a fixed dipole ("DIPOLE-1" in FIG. 6), which is negative on the silicon oxide film ("SiO$_2$-1" in FIG. 6) side and positive on the aluminum oxynitride film side, is formed. Further, since the nitrogen concentration of the aluminum oxynitride film is uniformly low, a fixed dipole ("DIPOLE-2" in FIG. 6), which is negative on the silicon oxide film ("SiO$_2$-2" in FIG. 6) side and positive on the aluminum oxynitride film side, is formed.

The change amount of $\Delta Ec$ of the two fixed dipoles is canceled out so that a work function ("WF" in FIG. 6) of the gate electrode does not change as compared to the case where there is no fixed dipole. Therefore, a threshold voltage of the MOSFET having the MOS structure of the second comparative example does not change.

In the MOSFET 100 of the first embodiment, the gate insulating layer 16 has the three-layer structure of the silicon oxide film 16a/the aluminum oxynitride film 16c/the silicon oxide film 16b. Further, it is possible to realize the high threshold voltage by setting the nitrogen concentration in the aluminum oxynitride film 16c on the silicon carbide layer 10 side to be lower than the nitrogen concentration thereof on the gate electrode 18 side.

The first atomic ratio of nitrogen (N/(O+N)) relative to the sum (O+N) of oxygen (O) and nitrogen (N) in the first position (C1 in FIG. 2) in the aluminum oxynitride film 16c is preferably 0.13 to 0.30. When lower than the above-described range, the crystallization of the aluminum oxynitride film 16c progresses with heat treatment at high temperature, and there is a risk that a leakage current of the gate insulating layer 16 increases. In addition, the crystallization of the aluminum oxynitride film 16c progresses, a trap level of the aluminum oxynitride film 16c increases, and there is a risk that the fluctuation of the threshold voltage due to the trapping of charges may increase. On the other hand, when higher than the above-described range, the change amount of $\Delta Ec$ caused by the fixed dipole decreases, and there is a risk that it is difficult to realize the high threshold voltage.

The second atomic ratio of nitrogen (N/(O+N)) relative to the sum (O+N) of oxygen (O) and nitrogen (N) in the second position (C2 in FIG. 2) in the aluminum oxynitride film 16c is preferably 0.70 to 0.87. When lower than the above-described range, the change amount of $\Delta Ec$ caused by the fixed dipole decreases, and there is a risk that it is difficult to realize the high threshold voltage. On the other hand, when higher than the above-described range, the crystallization of the aluminum oxynitride film 16c progresses with heat treatment at high temperature, and there is a risk that the leakage current of the gate insulating layer 16 increases. In addition, the crystallization of the aluminum oxynitride film 16c progresses, a trap level of the aluminum oxynitride film 16c increases, and there is a risk that the fluctuation of the threshold voltage due to the trapping of charges may increase.

From the viewpoint of realizing the high threshold voltage of the MOSFET 100, it is preferable that the first atomic ratio be 0.30 or lower and the second atomic ratio be 0.70 or higher.

It is more preferable that the first atomic ratio in the first position (C1 in FIG. 2) be 0.13 to 0.30, and the second atomic ratio in the second position (C2 in FIG. 2) be 0.70 to 0.87. Both the increase of the threshold voltage and the suppression of injection of charges into the gate insulating layer 16 are realized. At this time, for example, an atomic ratio (N/(O+N)) of nitrogen relative to the sum (O+N) of oxygen (O) and nitrogen (N) at a position other than the first position and the second position is preferably set to be 0.13 to 0.87. As the above-described atomic ratio is set to 0.13 to 0.87, it is possible to maintain the entire aluminum oxynitride film 16c in an amorphous state even in the case of performing densifying annealing (for example, 900° C.) or high-temperature annealing (for example, 1200° C.) to densify the gate insulating layer 16.

The distance (d1 in FIG. 2) from the interface between the silicon oxide film 16a and the aluminum oxynitride film 16c to the first position C1 is preferably 0.5 nm or shorter, more preferably 0.3 nm, and still more preferably 0.1 nm or shorter. In addition, the distance (d2 in FIG. 2) from the interface between the silicon oxide film 16b and the aluminum oxynitride film 16c to the second position C2 is preferably 0.5 nm or shorter, more preferably 0.3 nm, and still more preferably 0.1 nm or shorter. In addition, when longer than the above-described range, there is a risk that an effective fixed dipole is not formed.

Further, the MOSFET 100 includes the silicon oxide film 16a and the silicon oxide film 16b with high energy barriers on both sides of the aluminum oxynitride film 16c. Therefore, both passage of charges between the silicon carbide layer 10 and the aluminum oxynitride film 16c and passage of charges between the gate electrode 18 and the aluminum oxynitride film 16c are suppressed. Therefore, it is possible to suppress the leakage current of the gate insulating layer 16. In addition, the trapping of charges to the gate insulating layer 16 is suppressed, and the fluctuation of the threshold voltage is suppressed.

The film thickness of the silicon oxide film 16a is preferably thicker than the film thickness of the silicon oxide film 16b. The silicon oxide film 16a positioned below the silicon oxide film 16b has various forming process options, which makes it easy to form a film having higher quality than the silicon oxide film 16b. Therefore, it is possible to effectively suppress the leakage current of the gate insulating layer 16 by increasing the thickness of the silicon oxide film 16a.

The thickness of the gate insulating layer 16 is preferably 20 nm to 100 nm. In addition, the equivalent oxide thickness of the gate insulating layer 16 is preferably 20 nm to 100 nm. When thinner than the above-described range, there is a risk that the leakage current of the gate insulating layer 16 increases. In addition, there is a risk that the dielectric breakdown of the gate insulating layer 16 occurs. When thicker than the above-described range, there is a risk that a gate capacitance of the gate insulating layer 16 decreases and a driving force of the MOSFET 100 decreases.

The film thickness of the aluminum oxynitride film 16c is preferably, for example, 1 nm to 10 nm. When thinner than the above-described range, there is a risk that it is difficult to maintain the distribution of the nitrogen concentration in the aluminum oxynitride film 16c. If thicker than the above-described range, there is a risk that the proportion of the aluminum oxynitride film 16c account for the gate insulating layer 16 becomes too large so that the leakage current of the gate insulating layer 16 increases. In addition, there is a risk that the trapping amount of charges to the aluminum oxynitride film 16c increases and the threshold voltage fluctuates.

As described above, it is possible to realize the high threshold voltage according to the MOSFET 100 of the first embodiment. In addition, it is possible to suppress the leakage current of the gate insulating layer 16 and suppress the fluctuation of the threshold voltage.

Second Embodiment

A semiconductor device according to a second embodiment is the same as that of the first embodiment except that a gate insulating layer includes a third silicon oxide film and a second aluminum oxynitride film between a second silicon oxide film and the third silicon oxide film, and a third atomic ratio of nitrogen relative to a sum of oxygen and nitrogen at a third position in the second aluminum oxynitride film is lower than a fourth atomic ratio of nitrogen relative to a sum of oxygen and nitrogen at a fourth position, closer to the third silicon oxide film than the third position, in the second aluminum oxynitride film. Therefore, the content overlapping with that in the first embodiment will not be described.

Figure 7:
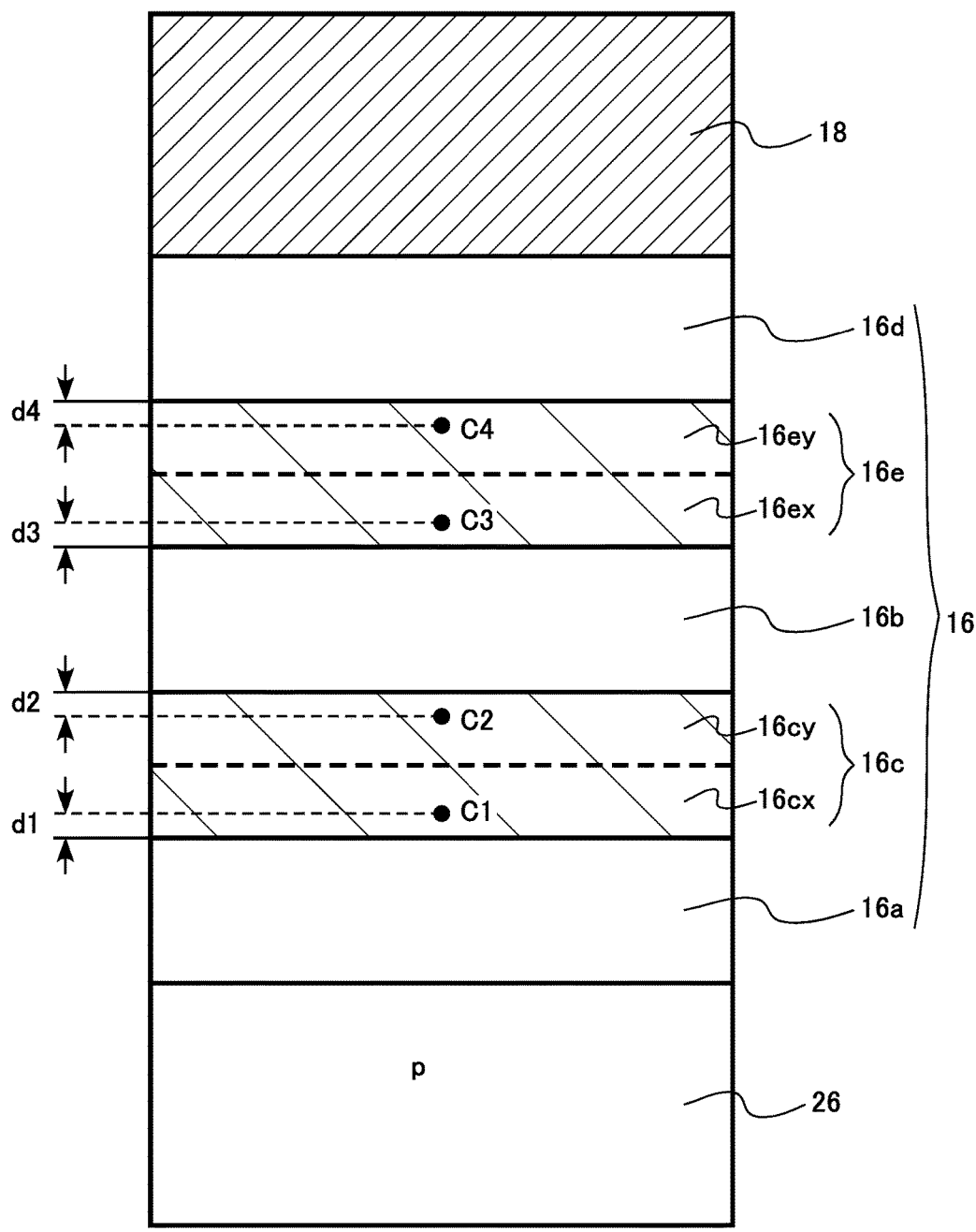
FIG. 7 is a schematic enlarged cross-sectional view of a semiconductor device according to a second embodiment.

FIG. 7 is a schematic enlarged cross-sectional view of the semiconductor device according to the second embodiment. FIG. 7 is the enlarged view of a gate insulating layer 16 between a body region 26 and a gate electrode 18 in FIG. 1.

The gate insulating layer 16 includes a silicon oxide film 16a (a first silicon oxide film), a silicon oxide film 16b (the second silicon oxide film), a silicon oxide film 16d (the third silicon oxide film), an aluminum oxynitride film 16c (a first aluminum oxynitride film), and an aluminum oxynitride film 16e (a second aluminum oxynitride film).

The silicon oxide film 16b is provided between the silicon oxide film 16a and the gate electrode 18. The aluminum oxynitride film 16c is provided between the silicon oxide film 16a and the silicon oxide film 16b. The aluminum oxynitride film 16e is provided between the silicon oxide film 16b and the silicon oxide film 16d.

A first atomic ratio (N/(O+N)) of nitrogen relative to a sum (O+N) of oxygen (O) and nitrogen (N) at a first position (C1 in FIG. 7) in the aluminum oxynitride film 16c is lower than a second atomic ratio of nitrogen (N/(O+N)) relative to a sum (O+N) of oxygen (O) and nitrogen (N) at a second position (C2 in FIG. 7) closer to the silicon oxide film 16b than the first position C1 in the aluminum oxynitride film 16c. In other words, the aluminum oxynitride film 16c has a nitrogen concentration on the silicon carbide layer 10 side which is lower than a nitrogen concentration on the gate electrode 18 side.

The aluminum oxynitride film 16c has the two-layer structure. The aluminum oxynitride film 16c includes a first region 16cx and a second region 16cy. The second region 16cy is positioned between the first region 16cx and the silicon oxide film 16b. The first position C1 is in the first region 16cx, and the second position C2 is in the second region 16cy.

The first position C1 is, for example, in the vicinity of an interface between the silicon oxide film 16a and the aluminum oxynitride film 16c. For example, a distance (d1 in FIG. 7) from the interface between the silicon oxide film 16a and the aluminum oxynitride film 16c to the first position C1 is 0.5 nm or shorter.

The second position C2 is, for example, in the vicinity of an interface between the silicon oxide film 16b and the aluminum oxynitride film 16c. For example, a distance (d2 in FIG. 7) from the interface between the silicon oxide film 16b and the aluminum oxynitride film 16c to the second position C2 is 0.5 nm or shorter.

The third atomic ratio (N/(O+N)) of nitrogen relative to the sum (O+N) of oxygen (O) and nitrogen (N) at the third position (C3 in FIG. 7) in the aluminum oxynitride film 16e is lower than the fourth atomic ratio of nitrogen (N/(O+N)) relative to the sum (O+N) of oxygen (O) and nitrogen (N) at the fourth position (C4 in FIG. 7) closer to the silicon oxide film 16d than the third position C3 in the aluminum oxynitride film 16e. In other words, the aluminum oxynitride film 16e has a nitrogen concentration on the silicon carbide layer 10 side which is lower than a nitrogen concentration on the gate electrode 18 side.

The aluminum oxynitride film 16e has a two-layer structure. The aluminum oxynitride film 16e includes a third region 16ex and a fourth region 16ey. The fourth region 16ey is positioned between the third region 16ex and the silicon oxide film 16d. The third position C3 is in the third region 16ex, and the fourth position C4 is in the fourth region 16ey.

The third position C3 is, for example, in the vicinity of an interface between the silicon oxide film 16b and the aluminum oxynitride film 16e. For example, a distance (d3 in FIG. 7) from the interface between the silicon oxide film 16b and the aluminum oxynitride film 16e to the third position C3 is 0.5 nm or shorter.

The fourth position C4 is, for example, in the vicinity of an interface between the silicon oxide film 16d and the aluminum oxynitride film 16e. For example, a distance (d4 in FIG. 7) from the interface between the silicon oxide film 16d and the aluminum oxynitride film 16e to the fourth position C4 is 0.5 nm or shorter.

In the MOSFET of the second embodiment, the gate insulating layer 16 has a five-layer structure of the silicon oxide film 16a/the aluminum oxynitride film 16c/the silicon oxide film 16b/the aluminum oxynitride film 16e/the silicon oxide film 16b. With this structure, it is possible to realize a higher threshold voltage than that of the first embodiment.

Specifically, for example, when the atomic ratio (first atomic ratio) of nitrogen in the first region 16cx and the atomic ratio (third atomic ratio) of nitrogen in the third region 16ex are 0.13, and the atomic ratio (second atomic ratio) of nitrogen in the second region 16cy and the atomic ratio (fourth atomic ratio) of nitrogen in the fourth region 16ey are 0.87, it is possible to increase the threshold voltage by about 2.04 V (=0.42 V+0.60 V+0.42 V+0.60 V).

Modified Example

A semiconductor device according to a modified example of the second embodiment includes: a wide bandgap semiconductor layer; a gate electrode; and a gate insulating layer positioned between the wide bandgap semiconductor layer and the gate electrode and having a plurality of stacked units each of which includes a first silicon oxide film, a second silicon oxide film between the first silicon oxide film and the gate electrode, and an aluminum oxynitride film between the first silicon oxide film and the second silicon oxide film, the gate insulating layer having a first atomic ratio of nitrogen relative to a sum of oxygen and nitrogen at a first position in the aluminum oxynitride film which is lower than a second atomic ratio of nitrogen relative to a sum of oxygen and nitrogen at a second position, closer to the second silicon oxide film than the first position, in the aluminum oxynitride film.

Figure 8:
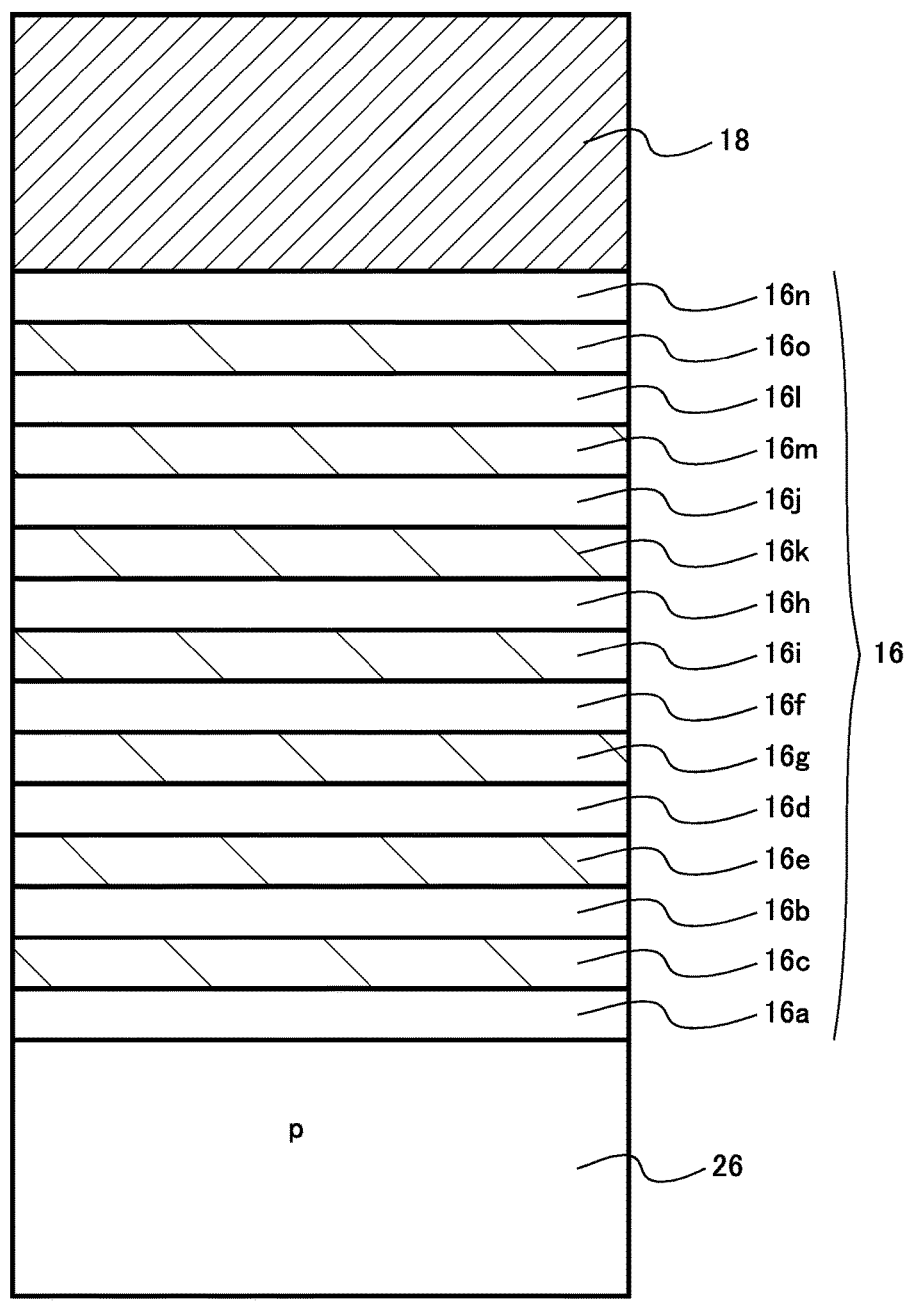
FIG. 8 is a schematic enlarged cross-sectional view of the semiconductor device according to a modified example of the second embodiment.

FIG. 8 is a schematic enlarged cross-sectional view of the semiconductor device according to the modified example of the second embodiment. FIG. 8 is the enlarged view of a gate insulating layer 16 between a body region 26 and a gate electrode 18 in FIG. 1.

The gate insulating layer 16 includes a silicon oxide film 16a (the first silicon oxide film), a silicon oxide film 16b (the second silicon oxide film), and an aluminum oxynitride film 16c (the first aluminum oxynitride film) at the lowermost layer. The gate insulating layer 16 has a three-layer structure of the silicon oxide film 16a/the aluminum oxynitride film 16c/the silicon oxide film 16b at the lowermost layer. This three-layer structure is one unit. The three-layer structure of the silicon oxide film 16a/the aluminum oxynitride film 16c/the silicon oxide film 16b is the same as that of the MOSFET 100 of the first embodiment.

The gate insulating layer 16 is formed by stacking the plurality of units each of which has the three-layer structure described above. Incidentally, the stacked upper and lower units share the same silicon oxide film.

The gate insulating layer 16 has a fifteen-layer structure of the silicon oxide film 16a/the aluminum oxynitride film 16c/the silicon oxide film 16b/an aluminum oxynitride film 16e/a silicon oxide film 16d/an aluminum oxynitride film 16g/a silicon oxide film 16f/an aluminum oxynitride film 16i/a silicon oxide film 16h/an aluminum oxynitride film 16k/a silicon oxide film 16j/an aluminum oxynitride film 16m/a silicon oxide film 16l/an aluminum oxynitride film 16o/a silicon oxide film 16n. The gate insulating layer 16 has a total of seven layers of the aluminum oxynitride films each of which is sandwiched between the silicon oxide films.

For example, when it is assumed that a single-layer aluminum oxynitride film provides an effect of increasing a threshold voltage by about 1.02 V, a threshold voltage increase effect of about 7.14 V can be obtained in the MOSFET of the modified example.

The aluminum oxynitride films each of which is sandwiched between the silicon oxide films included in the gate insulating layer 16 is not limited to the seven layers and may be less than seven layers or eight or more layers.

As described above, it is possible to realize the higher threshold voltage according to the MOSFET of the second embodiment and the MOSFET of the modified example.

Third Embodiment

A semiconductor device according to a third embodiment is different from that of the first embodiment in terms of being a so-called trench gate-type vertical MOSFET in which a gate insulating layer and a gate electrode are formed in a trench. Hereinafter, some of the content overlapping with that in the first embodiment will not be described.

Figure 9:
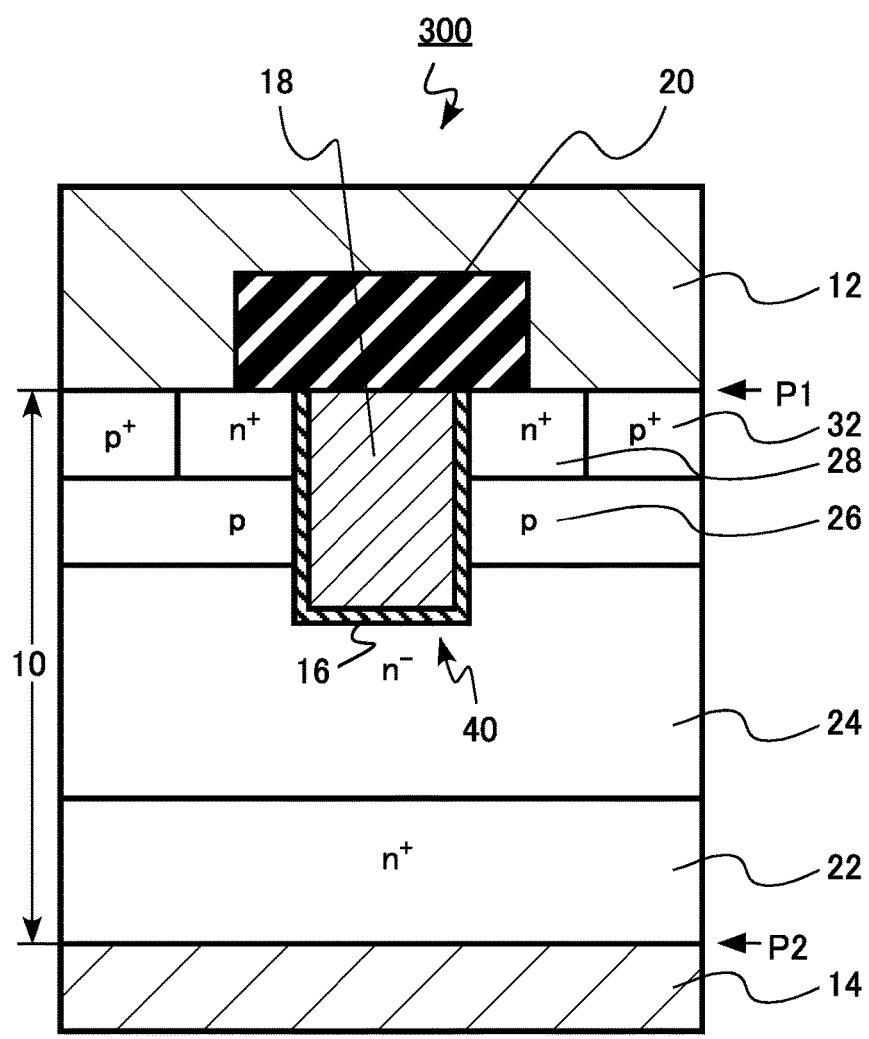
FIG. 9 is a schematic cross-sectional view of a semiconductor device according to a third embodiment.

FIG. 9 is a schematic cross-sectional view of the semiconductor device according to the third embodiment.

A MOSFET 300 includes a silicon carbide layer 10 (wide bandgap semiconductor layer), a source electrode 12, a drain electrode 14, a gate insulating layer 16, a gate electrode 18, an interlayer insulating layer 20, and a trench 40.

An n$^+$-type drain region 22, an n$^-$-type drift region 24, a p-type body region 26, an n$^+$-type source region 28, and a p$^+$-type body contact region 32 are provided inside the silicon carbide layer 10.

As illustrated in FIG. 9, the gate insulating layer 16 and the gate electrode 18 are formed inside the trench 40 provided in the silicon carbide layer 10 in the MOSFET 300 of the third embodiment. The gate insulating layer 16 is in contact with a drift region 24, a body region 26, and a source region 28. The MOSFET 300 has a trench gate structure.

The gate insulating layer 16 has a three-layer structure of a silicon oxide film 16a/an aluminum oxynitride film 16c/a silicon oxide film 16b from the silicon carbide layer 10 side, which is similar to the first embodiment.

As the MOSFET 300 adopts the trench gate structure, a degree of integration increases and an on-resistance decreases. Further, it is possible to shorten a channel length by utilizing improvement of cutoff characteristics. Therefore, the on-resistance can be further reduced. The channel length of the trench MOSFET can be shortened by reducing the thickness of the body region 26.

As described above, it is possible to realize a high threshold voltage according to the MOSFET 300 of the third embodiment, which is similar to the first embodiment. In addition, it is possible to realize the MOSFET 300 with the reduced on-resistance by adopting the trench gate structure.

Fourth Embodiment

A semiconductor device according to a fourth embodiment is different from that of the first embodiment in terms of being an HEMT using a nitride semiconductor. A basic layer structure of a gate insulating layer is the same as that of the modified example of the second embodiment. Hereinafter, the content overlapping with that in the first embodiment will not be described.

Figure 10:
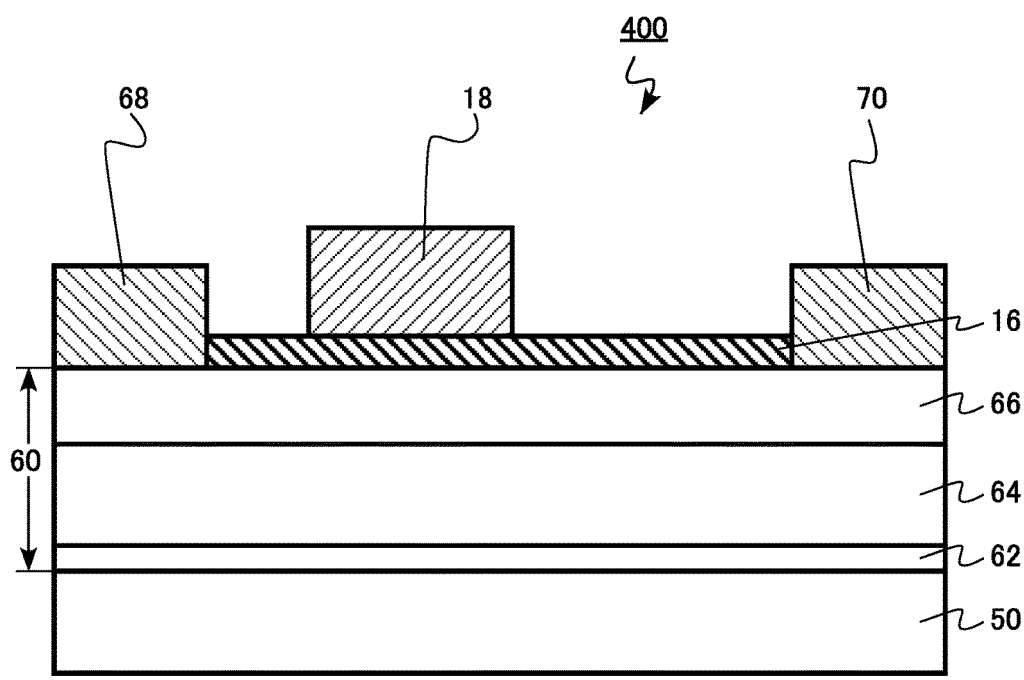
FIG. 10 is a schematic cross-sectional view of a semiconductor device according to a fourth embodiment.

FIG. 10 is a schematic cross-sectional view of the semiconductor device according to the fourth embodiment. An HEMT 400 of the fourth embodiment is the HEMT using the nitride semiconductor.

The nitride semiconductor is a so-called GaN-based semiconductor. The "GaN-based semiconductor" is a generic name of semiconductors having gallium nitride (GaN), aluminum nitride (AlN), indium nitride (InN), and intermediate compositions of these elements.

The HEMT 400 includes a substrate 50, a nitride semiconductor layer 60, a source electrode 68, a drain electrode 70, a gate insulating layer 16, and a gate electrode 18. The nitride semiconductor layer 60 is a semiconductor containing gallium (Ga). The nitride semiconductor layer 60 has a buffer layer 62, a channel layer 64, and a barrier layer 66.

The substrate 50 is formed using, for example, silicon (Si). It is also possible to apply, for example, sapphire ($Al_2O_3$) or silicon carbide (SiC) other than silicon.

The buffer layer 62 is provided on the substrate 50. The buffer layer 62 has a function of mitigating lattice mismatching between the substrate 50 and the channel layer 64. The buffer layer 62 is formed to have a multilayer structure of, for example, aluminum gallium nitride ($Al_WGa_{1-W}N$ ($0<W<1$)).

The channel layer 64 is provided on the buffer layer 62. The channel layer 64 is also referred to as an electron transit layer. The channel layer 64 contains gallium (Ga). The channel layer 64 is, for example, undoped $Al_XGa_{1-X}N$ ($0 \le X<1$). More specifically, the channel layer 64 is, for example, undoped gallium nitride (GaN). A film thickness of the channel layer 64 is, for example, 0.1 μm to 10 μm.

The barrier layer 66 is provided on the channel layer 64. The barrier layer 66 is also referred to as an electron supply layer. A bandgap of the barrier layer 66 is larger than a bandgap of the channel layer 64. The barrier layer 66 contains gallium (Ga). The barrier layer 66 is, for example, undoped aluminum gallium nitride ($Al_YGa_{1-Y}N$ ($0<Y\le1$, $X<Y$)). More specifically, the barrier layer 66 is, for example, undoped $Al_{0.25}Ga_{0.75}N$. A film thickness of the barrier layer 66 is, for example, 10 nm to 100 nm.

A heterojunction interface is formed between the channel layer 64 and the barrier layer 66. A two-dimensional electron gas (2DEG) is formed at the heterojunction interface and becomes a carrier of the HEMT.

The source electrode 68 is provided on the channel layer 64 and the barrier layer 66. The source electrode 68 is electrically connected to the channel layer 64 and the barrier layer 66.

The source electrode 68 is, for example, a metal electrode. The source electrode 68 has, for example, a stacked structure of titanium (Ti) and aluminum (Al). It is desirable to obtain ohmic contact between the source electrode 68 and the barrier layer 66.

The drain electrode 70 is provided on the channel layer 64 and the barrier layer 66. The drain electrode 70 is electrically connected to the channel layer 64 and the barrier layer 66.

The drain electrode 70 is, for example, a metal electrode. The drain electrode 70 has, for example, a stacked structure of titanium (Ti) and aluminum (Al). It is desirable to obtain ohmic contact between the drain electrode 70 and the barrier layer 66.

A distance between the source electrode 68 and the drain electrode 70 is, for example, 5 μm to 30 μm.

The gate electrode 18 is provided on the channel layer 64 and the barrier layer 66. The gate electrode 18 is provided between the source electrode 68 and the drain electrode 70.

The gate electrode 18 is, for example, a metal electrode. The gate electrode 18 is, for example, titanium nitride (TiN).

Figure 11:
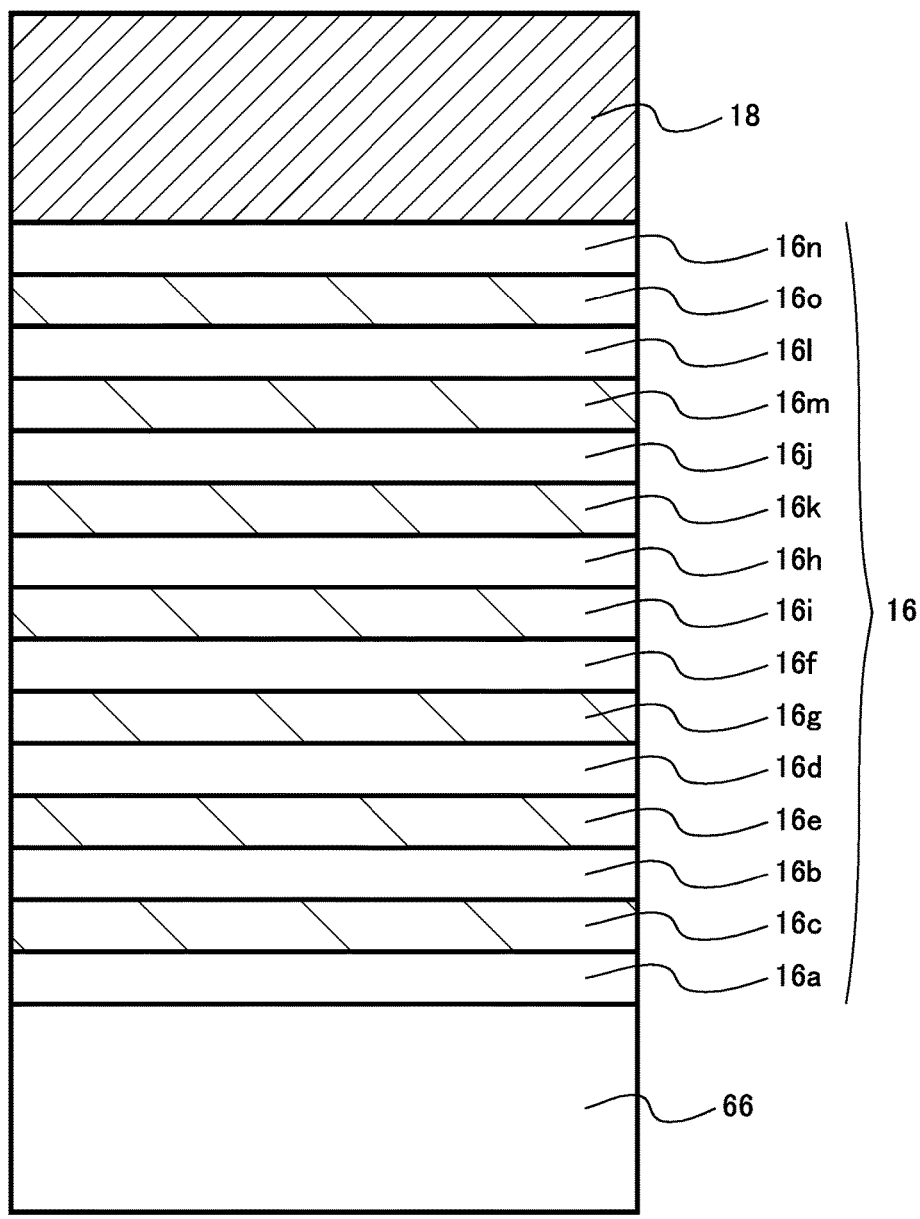
FIG. 11 is a schematic enlarged cross-sectional view of the semiconductor device according to the fourth embodiment.

FIG. 11 is a schematic enlarged cross-sectional view of the semiconductor device according to the fourth embodiment. FIG. 11 is the enlarged view of the gate insulating layer 16 between the barrier layer 66 and the gate electrode 18.

The gate insulating layer 16 is positioned between the nitride semiconductor layer 60 and the gate electrode 18. The gate insulating layer 16 is provided between the gate electrode 18 and the barrier layer 66. The gate insulating layer 16 is in contact with the barrier layer 66.

The gate insulating layer 16 includes a silicon oxide film 16a (the first silicon oxide film), a silicon oxide film 16b (the second silicon oxide film), and an aluminum oxynitride film 16c (the first aluminum oxynitride film) at the lowermost layer. The gate insulating layer 16 has a three-layer structure of the silicon oxide film 16a/the aluminum oxynitride film 16c/the silicon oxide film 16b at the lowermost layer. This three-layer structure is one unit. The three-layer structure of the silicon oxide film 16a/the aluminum oxynitride film 16c/the silicon oxide film 16b is the same as that of the MOSFET 100 of the first embodiment.

The gate insulating layer 16 is formed by stacking the plurality of units each of which has the three-layer structure described above. Incidentally, the stacked upper and lower units share the same silicon oxide film.

The gate insulating layer 16 has a fifteen-layer structure of the silicon oxide film 16a/the aluminum oxynitride film 16c/the silicon oxide film 16b/an aluminum oxynitride film 16e/a silicon oxide film 16d/an aluminum oxynitride film 16g/a silicon oxide film 16f/an aluminum oxynitride film 16i/a silicon oxide film 16h/an aluminum oxynitride film 16k/a silicon oxide film 16j/an aluminum oxynitride film 16m/a silicon oxide film 16l/an aluminum oxynitride film 16o/a silicon oxide film 16n. The gate insulating layer 16 has a total of seven layers of the aluminum oxynitride films each of which is sandwiched between the silicon oxide films.

For example, when it is assumed that a single-layer aluminum oxynitride film provides an effect of increasing a threshold voltage by about 1.02 V, a threshold voltage increase effect of about 7.14 V can be obtained in the HEMT 400.

In general, the two-dimensional electron gas exists below the gate electrode in the HEMT, so that a normally-on operation is performed. However, it is possible to perform a normally-off operation due to a threshold voltage increase effect caused by a fixed dipole in the gate insulating layer 16 according to the HEMT 400.

The aluminum oxynitride films each of which is sandwiched between the silicon oxide films included in the gate insulating layer 16 is not limited to the seven layers and may be less than seven layers or eight or more layers.

In addition, it is also possible to provide a p-type layer between the gate insulating layer 16 and the gate electrode 18 from the viewpoint of further increasing the threshold voltage of the HEMT 400. The p-type layer is, for example, polycrystalline p-type gallium nitride (GaN).

As described above, it is possible to realize the high threshold voltage according to the HEMT 400 of the fourth embodiment.

Fifth Embodiment

A semiconductor device according to a fifth embodiment is different from that of the fourth embodiment in terms of having a so-called gate-recess structure in which a gate electrode is buried in a trench (recess) formed in a barrier layer. Therefore, the content overlapping with that in the fourth embodiment will not be described.

Figure 12:
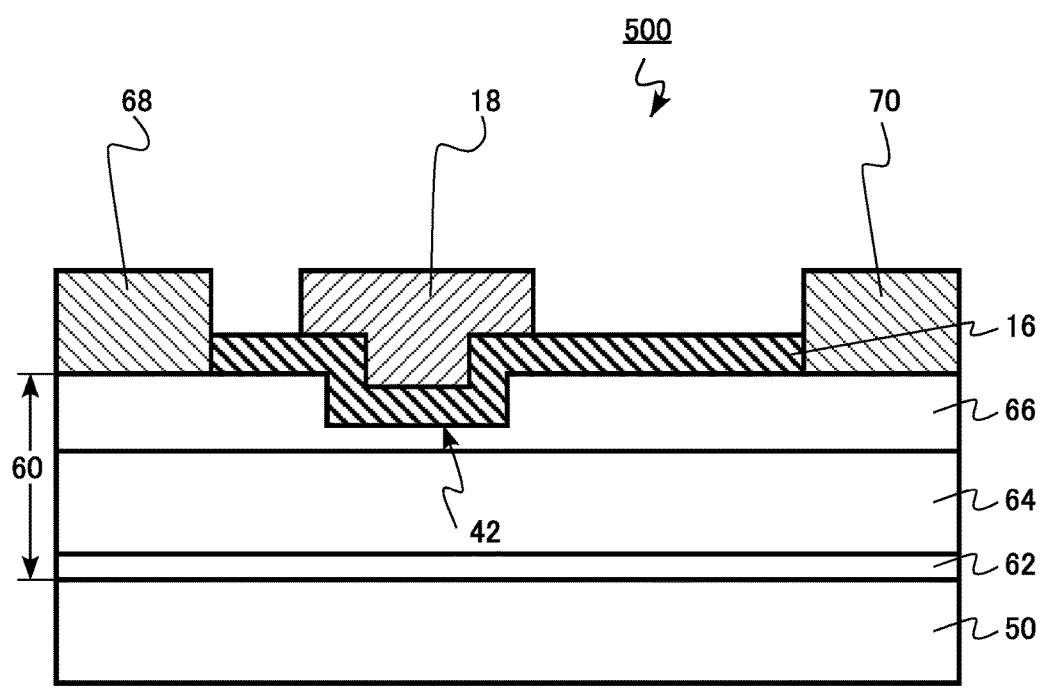
FIG. 12 is a schematic cross-sectional view of a semiconductor device according to a fifth embodiment.

FIG. 12 is a schematic cross-sectional view of the semiconductor device according to the fifth embodiment. An HEMT 500 of the fifth embodiment is an HEMT using a nitride semiconductor containing gallium (Ga).

The HEMT 500 includes a substrate 50, a nitride semiconductor layer 60, a source electrode 68, a drain electrode 70, a gate insulating layer 16, a gate electrode 18, and a trench 42. The nitride semiconductor layer 60 is a semiconductor containing gallium (Ga). The nitride semiconductor layer 60 has a buffer layer 62, a channel layer 64, and a barrier layer 66.

The bottom of the trench 42 is positioned inside the barrier layer 66. The gate insulating layer 16 and the gate electrode 18 are formed inside the trench 42. As the HEMT 500 has the gate-recess structure, density of a two-dimensional electron gas below the gate electrode 18 is reduced, and a threshold voltage increases.

The gate insulating layer 16 has, for example, a three-layer structure of a silicon oxide film 16*a*/an aluminum oxynitride film 16*c*/a silicon oxide film 16*b*, which is similar to the first embodiment. The threshold voltage increases by, for example, about 1.02 V due to the gate insulating layer 16.

As described above, it is possible to realize the high threshold voltage according to the HEMT 500 of the fifth embodiment.

Sixth Embodiment

A semiconductor device according to a sixth embodiment is different from that of the fifth embodiment in terms that a depth of a trench is deeper than that of the fifth embodiment. Therefore, the content overlapping with that in the fifth embodiment will not be described.

Figure 13:
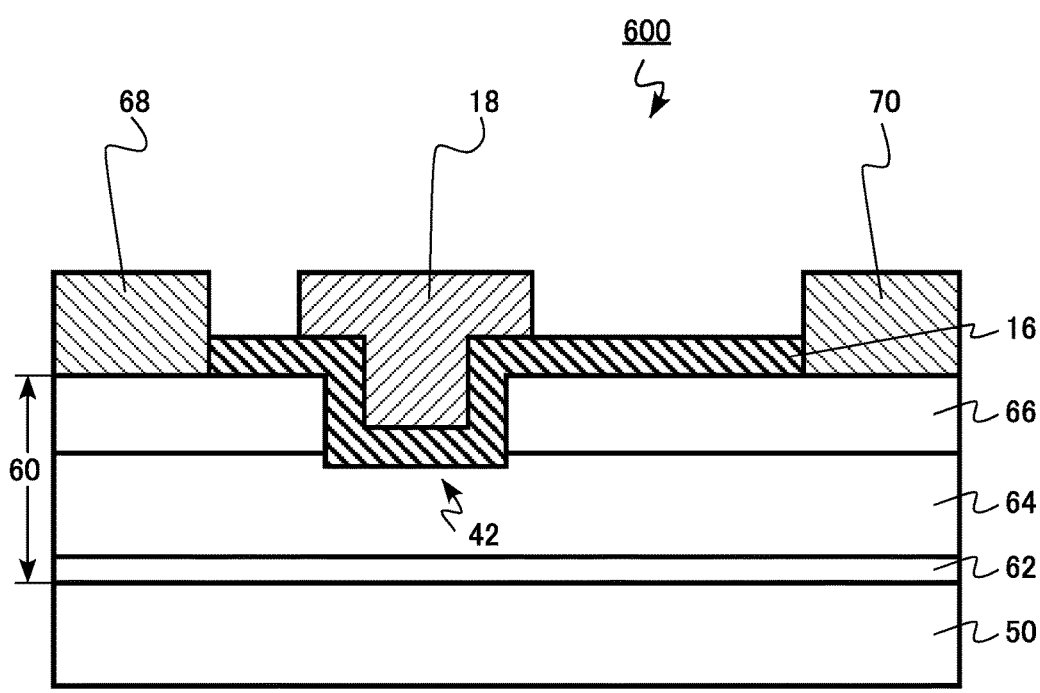
FIG. 13 is a schematic cross-sectional view of a semiconductor device according to a sixth embodiment.

FIG. 13 is a schematic cross-sectional view of the semiconductor device according to the sixth embodiment. An HEMT 600 of the sixth embodiment is an HEMT using a nitride semiconductor containing gallium (Ga).

The HEMT 600 includes a substrate 50, a nitride semiconductor layer 60, a source electrode 68, a drain electrode 70, a gate insulating layer 16, a gate electrode 18, and a trench 42. The nitride semiconductor layer 60 is a semiconductor containing gallium (Ga). The nitride semiconductor layer 60 has a buffer layer 62, a channel layer 64, and a barrier layer 66.

The bottom of the trench 42 is positioned inside the channel layer 64. The gate insulating layer 16 and the gate electrode 18 are formed inside the trench 42. The HEMT 600 has a gate-recess structure so that a threshold voltage increases. Further, as the bottom of the trench 42 is positioned in the channel layer 64, a two-dimensional electron gas below the gate electrode 18 is reduced. Therefore, the threshold voltage becomes higher than that of the HEMT 500 of the fifth embodiment.

The gate insulating layer 16 has, for example, a three-layer structure of a silicon oxide film 16*a*/an aluminum oxynitride film 16*c*/a silicon oxide film 16*b*, which is similar to the first embodiment. The threshold voltage increases by, for example, about 1.02 V due to the gate insulating layer 16.

As described above, it is possible to realize the high threshold voltage according to the HEMT 600 of the sixth embodiment.

Seventh Embodiment

An inverter circuit and a driving device according to a seventh embodiment correspond to a driving device that includes the semiconductor device according to the first to third embodiments.

Figure 14:
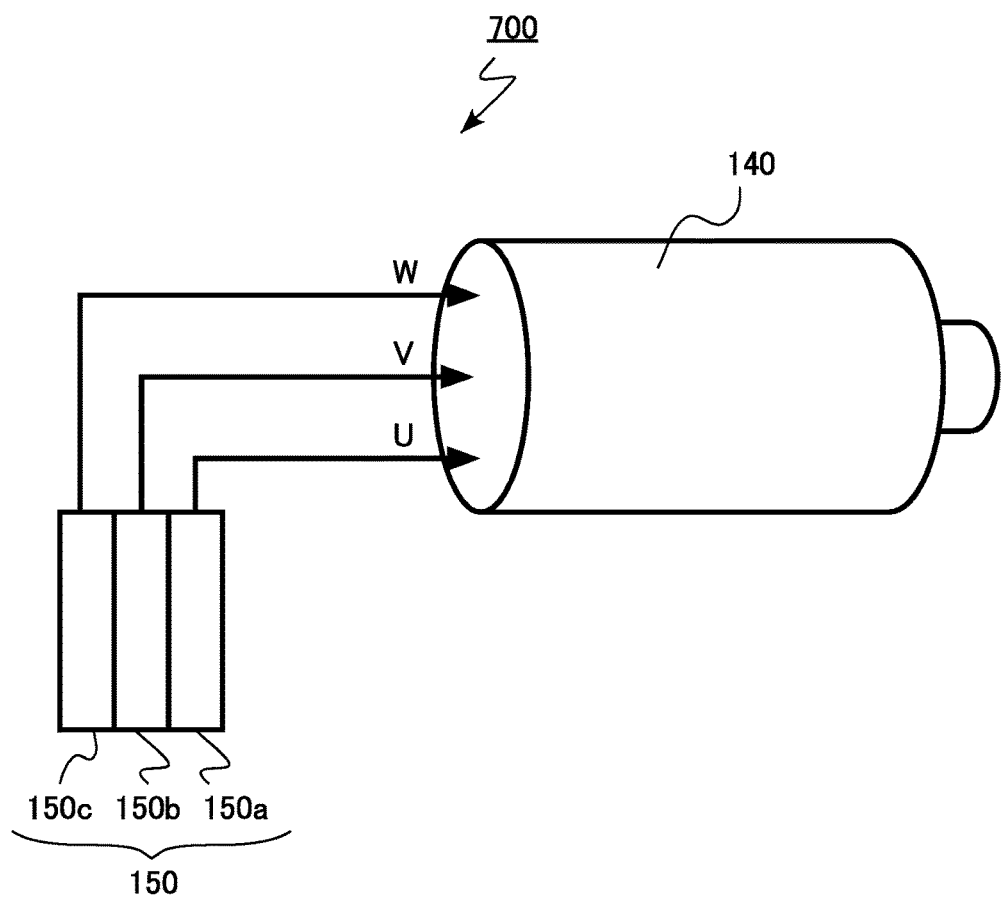
FIG. 14 is a schematic view of a driving device of a seventh embodiment.

FIG. 14 is a schematic view of the driving device of the seventh embodiment. A driving device 700 includes a motor 140 and an inverter circuit 150.

For example, the inverter circuit 150 includes three semiconductor modules 150*a*, 150*b*, and 150*c* using the MOSFET 100 of the first embodiment as a switching element. The three-phase inverter circuit 150 having three AC voltage output terminals U, V, and W is realized by connecting the three semiconductor modules 150*a*, 150*b*, and 150*c* in parallel. The motor 140 is driven by the AC voltage output from the inverter circuit 150.

According to the seventh embodiment, characteristics of the inverter circuit 150 and the driving device 700 are improved by providing the MOSFET 100 with the high threshold voltage.

Eighth Embodiment

A vehicle according to an eighth embodiment is a vehicle that includes the semiconductor device according to the first to third embodiments.

Figure 15:
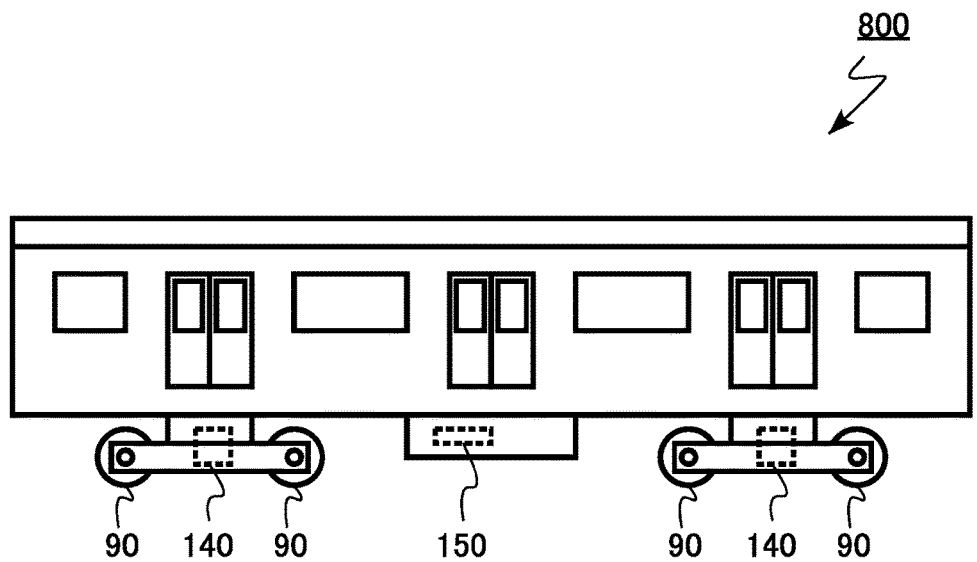
FIG. 15 is a schematic view of a vehicle of an eighth embodiment.

FIG. 15 is a schematic view of the vehicle of the eighth embodiment. A vehicle 800 of the eighth embodiment is a railway vehicle. The vehicle 800 includes a motor 140 and an inverter circuit 150.

For example, the inverter circuit 150 includes three semiconductor modules using the MOSFET 100 of the first embodiment as a switching element. The three-phase inverter circuit 150 having three AC voltage output terminals U, V, and W is realized by connecting the three semiconductor modules in parallel. The motor 140 is driven by the AC voltage output from the inverter circuit 150. Wheels 90 of the vehicle 800 are rotated by the motor 140.

According to the eighth embodiment, characteristics of the vehicle 800 are improved by providing the MOSFET with the high threshold voltage.

Ninth Embodiment

A vehicle according to a ninth embodiment is a vehicle that includes the semiconductor device according to the first to third embodiments.

Figure 16:
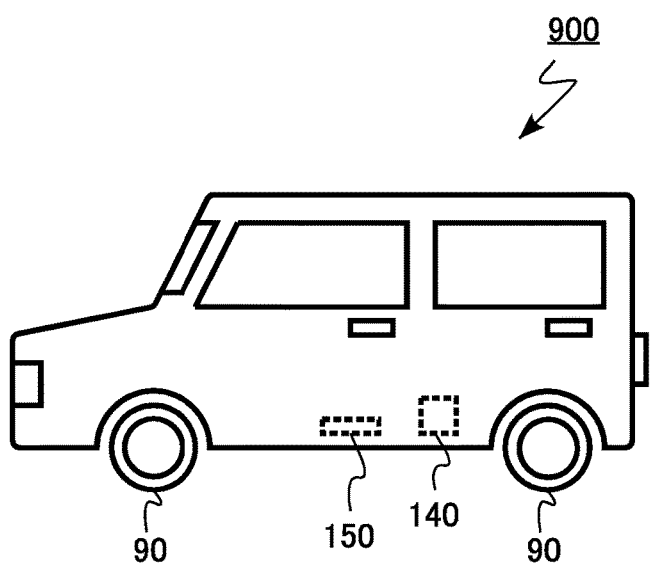
FIG. 16 is a schematic view of a vehicle of a ninth embodiment.

FIG. 16 is a schematic view of the vehicle of the ninth embodiment. A vehicle 900 of the ninth embodiment is a car. The vehicle 900 includes a motor 140 and an inverter circuit 150.

For example, the inverter circuit 150 includes three semiconductor modules using the MOSFET 100 of the first embodiment as a switching element. The three-phase inverter circuit 150 having three AC voltage output terminals U, V, and W is realized by connecting the three semiconductor modules in parallel.

The motor 140 is driven by the AC voltage output from the inverter circuit 150. Wheels 90 of the vehicle 900 are rotated by the motor 140.

According to the ninth embodiment, characteristics of the vehicle 900 are improved by providing the MOSFET with the high threshold voltage.

Tenth Embodiment

An elevator according to a tenth embodiment is an elevator that includes the semiconductor device according to the first to third embodiments.

Figure 17:
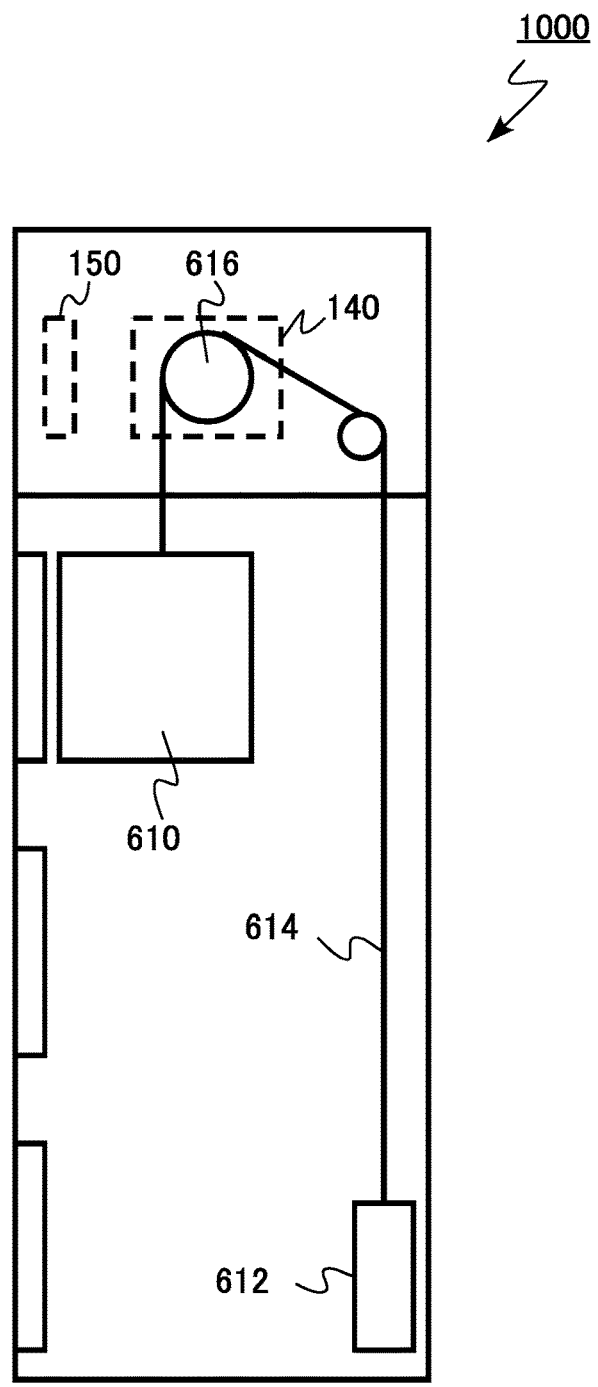
FIG. 17 is a schematic view of an elevator of a tenth embodiment.

FIG. 17 is a schematic view of the elevator of the tenth embodiment. An elevator 1000 of the tenth embodiment includes an elevator car 610, a counterweight 612, a wire rope 614, a hoisting machine 616, a motor 140, and an inverter circuit 150.

For example, the inverter circuit 150 includes three semiconductor modules using the MOSFET 100 of the first embodiment as a switching element. The three-phase inverter circuit 150 having three AC voltage output terminals U, V, and W is realized by connecting the three semiconductor modules in parallel.

The motor 140 is driven by the AC voltage output from the inverter circuit 150. The hoisting machine 616 is rotated by the motor 140 to move the elevator car 610 up and down.

According to the tenth embodiment, characteristics of the elevator 1000 are improved by providing the high-threshold-voltage MOSFET with improved characteristics.

Eleventh Embodiment

A power supply circuit and a computer according to an eleventh embodiment include the HEMT according to the fourth to sixth embodiments.

Figure 18:
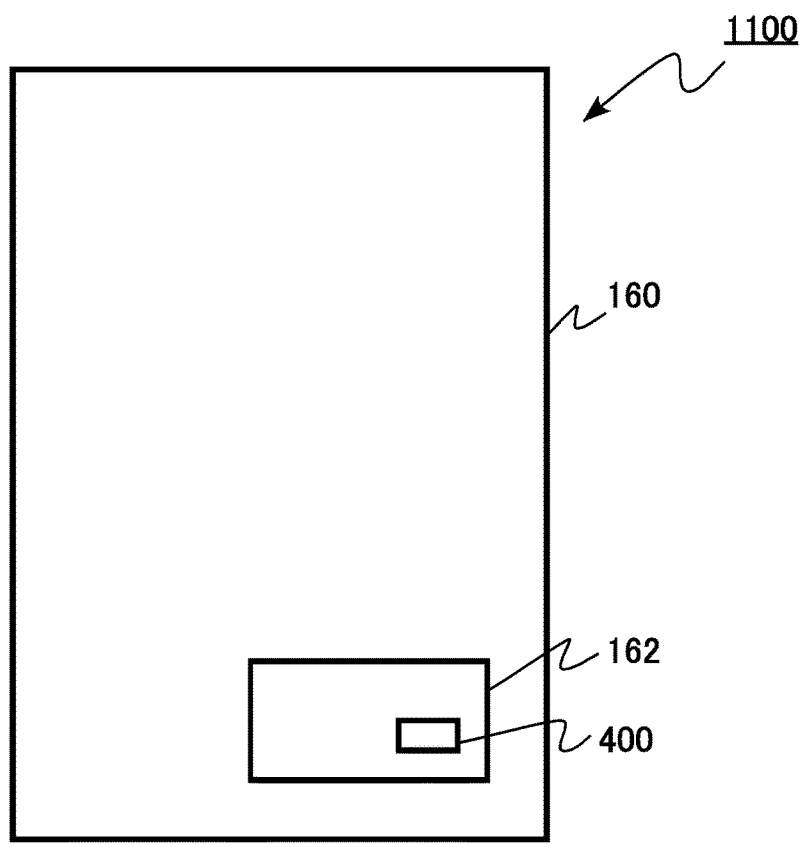
FIG. 18 is a schematic view of a computer according to an eleventh embodiment.

FIG. 18 is a schematic view of the computer according to the eleventh embodiment. The computer of the eleventh embodiment is, for example, a server 1100.

The server 1100 has a power supply circuit 162 in a housing 160. The server 1100 is the computer that runs server software. The power supply circuit 162 includes, for example, the HEMT 400 of the fourth embodiment.

The power supply circuit 162 has the HEMT with the high threshold voltage, thereby realizing a stable operation. In addition, a stable operation of the server 1100 is realized by including the power supply circuit 162.

According to the eleventh embodiment, it is possible to realize the power supply circuit and the computer whose stable operation is realized.

As described above, the description has been given in the first to third embodiments by exemplifying the case of 4H—SiC as the crystal structure of silicon carbide, but the present disclosure can also be applied to silicon carbide having other crystal structures such as 6H—SiC and 3C—SiC.

In addition, the description has been given in the first and second embodiments by exemplifying the case where the gate insulating layer 16 is provided on the silicon face of silicon carbide, but the present disclosure can also be applied to a case where the gate insulating layer 16 is provided on another face, for example, a carbon face, an a face, an m face, a (0-33-8) face, or the like of silicon carbide. In the third embodiment, the description has been given by exemplifying the side face of the trench formed by digging a silicon face of silicon carbide, but a trench may be formed by digging a carbon face. In addition, representatives of the side face of the trench are the a face, the m face, the (0-33-8) face, and the like, but this technique may be established for every face orientation. In addition, a substrate with an off-angle may be used, and the face orientations of side faces of the trench may be different.

In addition, the present disclosure can also be applied to an n-channel IGBT. It is possible to realize an IGBT by replacing a region corresponding to the drain region 22 of the MOSFET of the first to third embodiments from the n-type to the p-type.

In addition, the description has been given in the seventh to tenth embodiments by exemplifying the case where the semiconductor device of the present disclosure is applied to a vehicle or an elevator has been described as an example, but the semiconductor device of the present disclosure can also be applied to, for example, a power conditioner of a photovoltaic power generation system or the like.

In addition, the description has been given in the fourth to sixth embodiments by exemplifying the undoped aluminum gallium nitride as the barrier layer 66, but n-type aluminum gallium nitride can also be applied.

While certain embodiments have been described, these embodiments have been presented by way of example only, and are not intended to limit the scope of the inventions. Indeed, the semiconductor device, the inverter circuit, the driving device, the vehicle, the elevator, the power supply circuit, and, the computer described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A semiconductor device comprising:
a wide bandgap semiconductor layer;
a gate electrode; and
a gate insulating layer disposed between the wide bandgap semiconductor layer and the gate electrode, the gate insulating layer including a first silicon oxide film, a second silicon oxide, and a first aluminum oxynitride film, the second silicon oxide film disposed between the first silicon oxide film and the gate electrode, the first aluminum oxynitride film between the first silicon oxide film and the second silicon oxide film, a first atomic ratio of nitrogen relative to a sum of oxygen and nitrogen at a first position in the first aluminum oxynitride film being lower than a second atomic ratio of nitrogen relative to a sum of oxygen and nitrogen at a second position in the first aluminum oxynitride film, and the second position being closer to the second silicon oxide film than the first position.

2. The semiconductor device according to claim 1, wherein
the first atomic ratio is 0.13 to 0.30.

3. The semiconductor device according to claim 1, wherein
the second atomic ratio is 0.70 to 0.87.

4. The semiconductor device according to claim 1, wherein
a distance from an interface between the first silicon oxide film and the first aluminum oxynitride film to the first position is 0.5 nm or shorter, and
a distance from an interface between the second silicon oxide film and the first aluminum oxynitride film to the second position is 0.5 nm or shorter.

5. The semiconductor device according to claim 1, wherein
a film thickness of the first aluminum oxynitride film is 1 nm to 10 nm.

6. The semiconductor device according to claim 1, wherein
a film thickness of the first silicon oxide film is thicker than a film thickness of the second silicon oxide film.

7. The semiconductor device according to claim 1, wherein
the gate insulating layer further includes a third silicon oxide film and a second aluminum oxynitride film, the second aluminum oxynitride film disposed between the second silicon oxide film and the third silicon oxide film, and
a third atomic ratio of nitrogen relative to a sum of oxygen and nitrogen at a third position in the second aluminum oxynitride film is lower than a fourth atomic ratio of nitrogen relative to a sum of oxygen and nitrogen at a fourth position in the second aluminum oxynitride film, and the fourth position is closer to the third silicon oxide film than the third position.

8. The semiconductor device according to claim 1, wherein
a thickness of the gate insulating layer is 20 nm to 100 nm.

9. The semiconductor device according to claim 1, wherein
the wide bandgap semiconductor layer contains silicon carbide.

10. The semiconductor device according to claim 1, wherein
the wide bandgap semiconductor layer contains a nitride semiconductor.

11. An inverter circuit comprising the semiconductor device according to claim 9.

12. A driving device comprising the semiconductor device according to claim 9.

13. A vehicle comprising the semiconductor device according to claim 9.

14. An elevator comprising the semiconductor device according to claim 9.

15. A power supply circuit comprising the semiconductor device according to claim 10.

16. A computer comprising the semiconductor device according to claim 10.

17. A semiconductor device comprising:
a wide bandgap semiconductor layer;
a gate electrode; and
a gate insulating layer disposed between the wide bandgap semiconductor layer and the gate electrode, the gate insulating layer having a plurality of stacked units each of which includes a first silicon oxide film, a second silicon oxide film, and an aluminum oxynitride film, the second silicon oxide film disposed between the first silicon oxide film and the gate electrode, and the aluminum oxynitride film disposed between the first silicon oxide film and the second silicon oxide film,
wherein a first atomic ratio of nitrogen relative to a sum of oxygen and nitrogen at a first position in the aluminum oxynitride film is lower than a second atomic ratio of nitrogen relative to a sum of oxygen and nitrogen at a second position in the aluminum oxynitride film, and the second position is closer to the second silicon oxide film than the first position.

18. The semiconductor device according to claim 17, wherein
the first atomic ratio is 0.13 to 0.30.

19. The semiconductor device according to claim 17, wherein
the second atomic ratio is 0.70 to 0.87.

20. The semiconductor device according to claim 17, wherein
the wide bandgap semiconductor layer contains silicon carbide.

21. The semiconductor device according to claim 17, wherein
the wide bandgap semiconductor layer contains a nitride semiconductor.

* * * * *